(12) United States Patent
Tsutsumi et al.

(10) Patent No.: US 6,713,748 B1
(45) Date of Patent: Mar. 30, 2004

(54) IMAGE DETECTION DEVICE

(75) Inventors: Junsei Tsutsumi, Chigasaki (JP); Akira Kinno, Yokohama (JP); Mitsushi Ikeda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/337,524

(22) Filed: Jun. 22, 1999

(30) Foreign Application Priority Data

Jun. 22, 1998 (JP) .......................... 10/175015

(51) Int. Cl.[7] .......................... H01L 27/00; H01L 31/00
(52) U.S. Cl. ................... 250/208.1; 250/214.1
(58) Field of Search .................... 250/208.1, 214.1; 257/336, 344, 408, 211

(56) References Cited

U.S. PATENT DOCUMENTS 4,990,984 A * 2/1991 Misu .................. 357/23.13
5,412,493 A * 5/1995 Kunii et al. ................ 257/408

FOREIGN PATENT DOCUMENTS

JP         8-160464         6/1996

* cited by examiner

*Primary Examiner*—Zandra V. Smith
(74) *Attorney, Agent, or Firm*—Oblon, Spivak, McClelland, Maier & Neustadt, P.C.

(57) ABSTRACT

An image detection device includes a pixel portion (OEF) having a photoelectric conversion film for converting incident light into a signal charge and a pixel capacitor for accumulating the signal charge, and a thin film transistor (TFT1) included in a signal detective circuit operation of which is controlled by a scanning line (G1) to read out the potential of a pixel electrode to a signal line (S1). The transistor (TFT1) having a source or drain connected to the pixel electrode is a TFT having an LDD structure on a high-potential side, a TFT having LDD structures on the high- and low-potential sides in which the LDD length is larger on the high-potential side, or a TFT having a double-gate structure. When the image detection device includes a protective diode (TFT2) for, if the potential of the pixel electrode reaches a predetermined value or more, flowing pixel charges to a bias line (B1) to prevent destruction of the pixel electrode, the transistor (TFT2) has an LDD structure on at least a high-potential side or a double-gate structure. This arrangement can increase the OFF resistance to suppress the leakage current, and can prevent a decrease in S/N ratio owing to leakage of signal charges before a read.

17 Claims, 17 Drawing Sheets

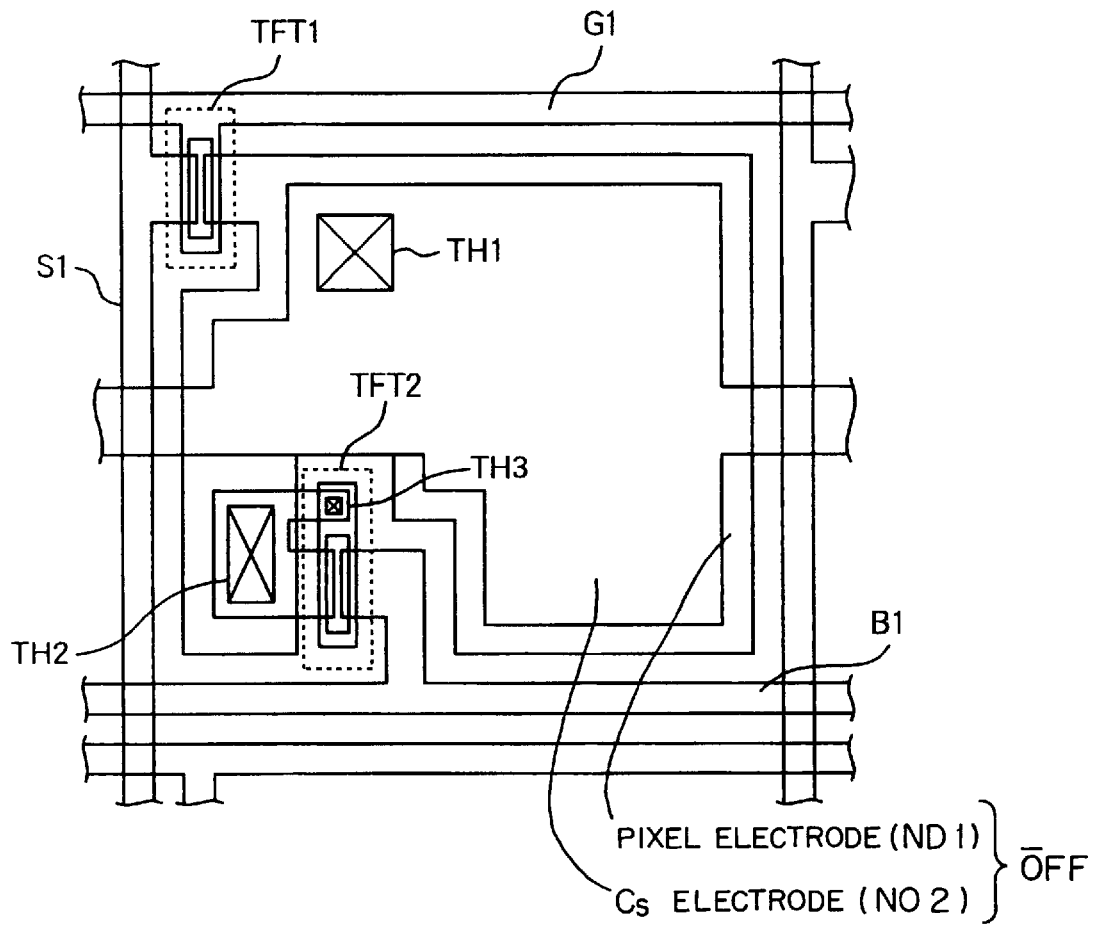
F I G. 1
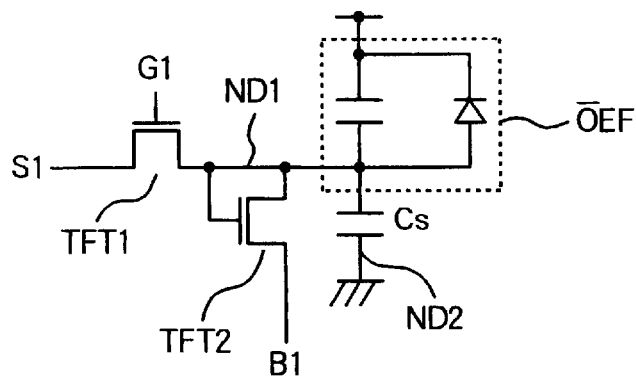
F I G. 2

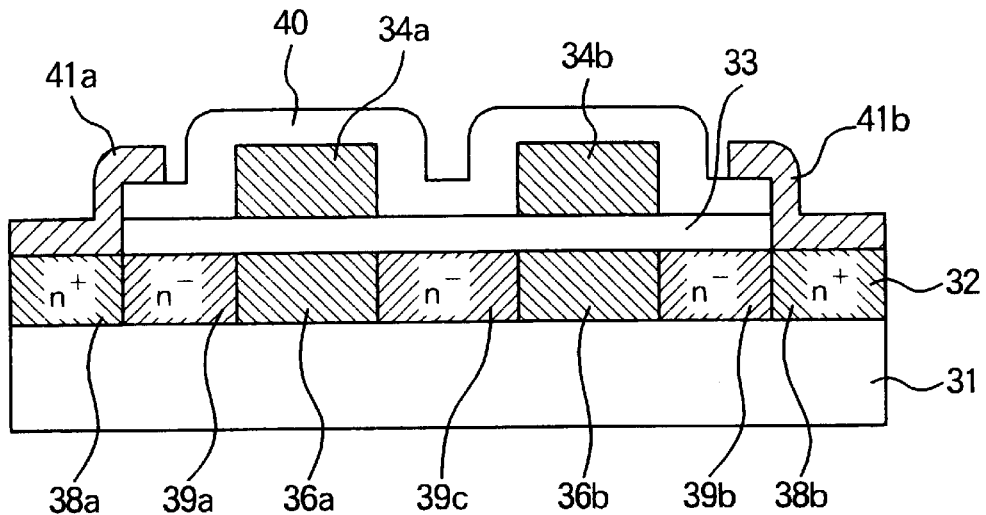
F I G. 5
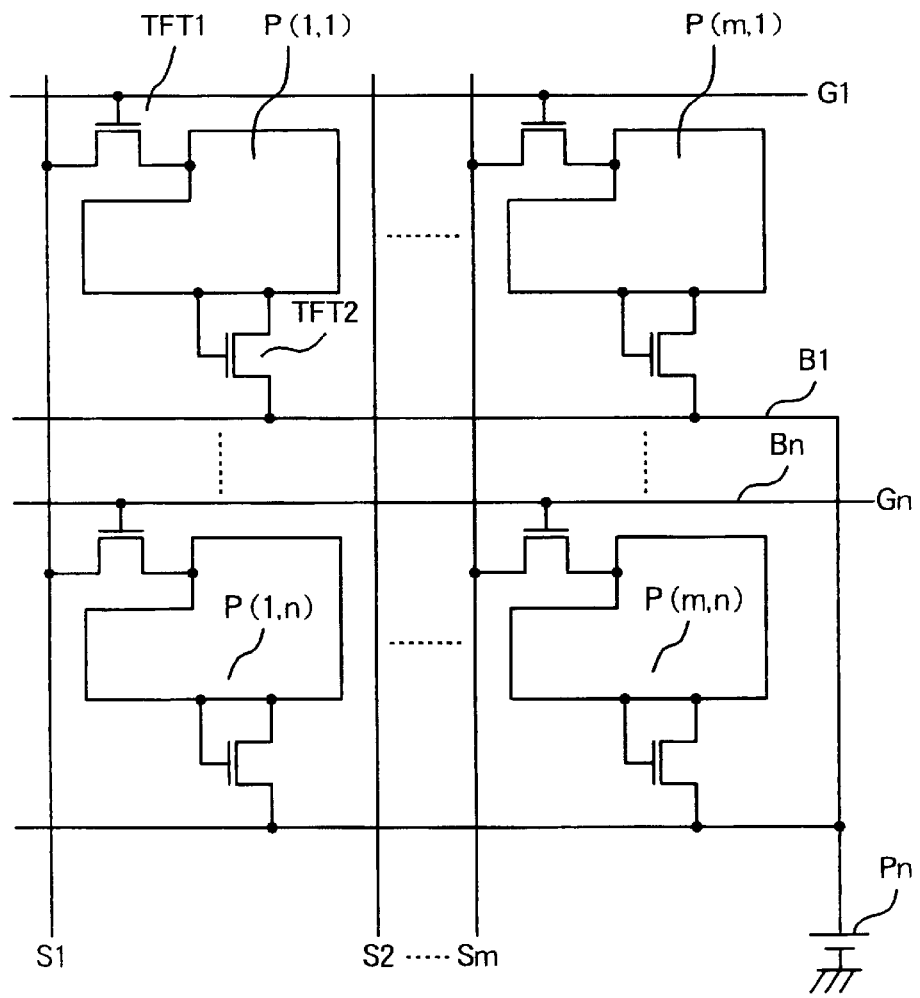
F I G. 6

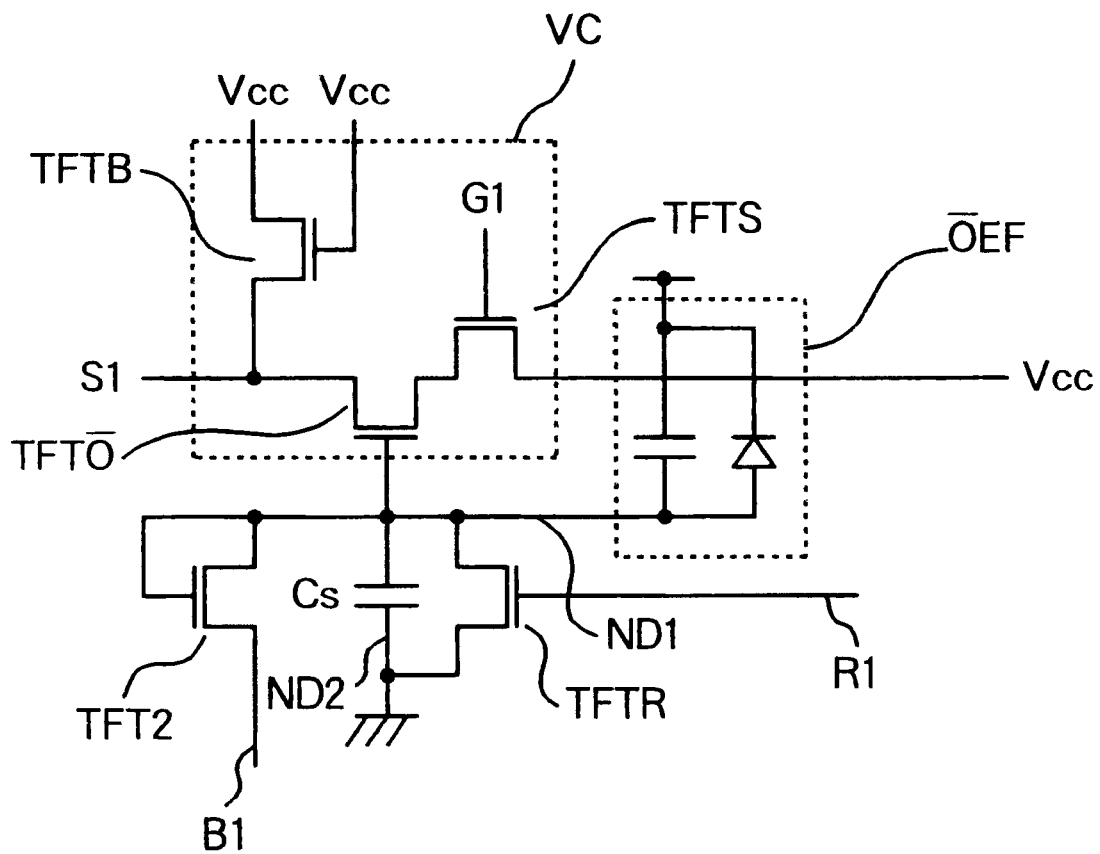
F I G. 10

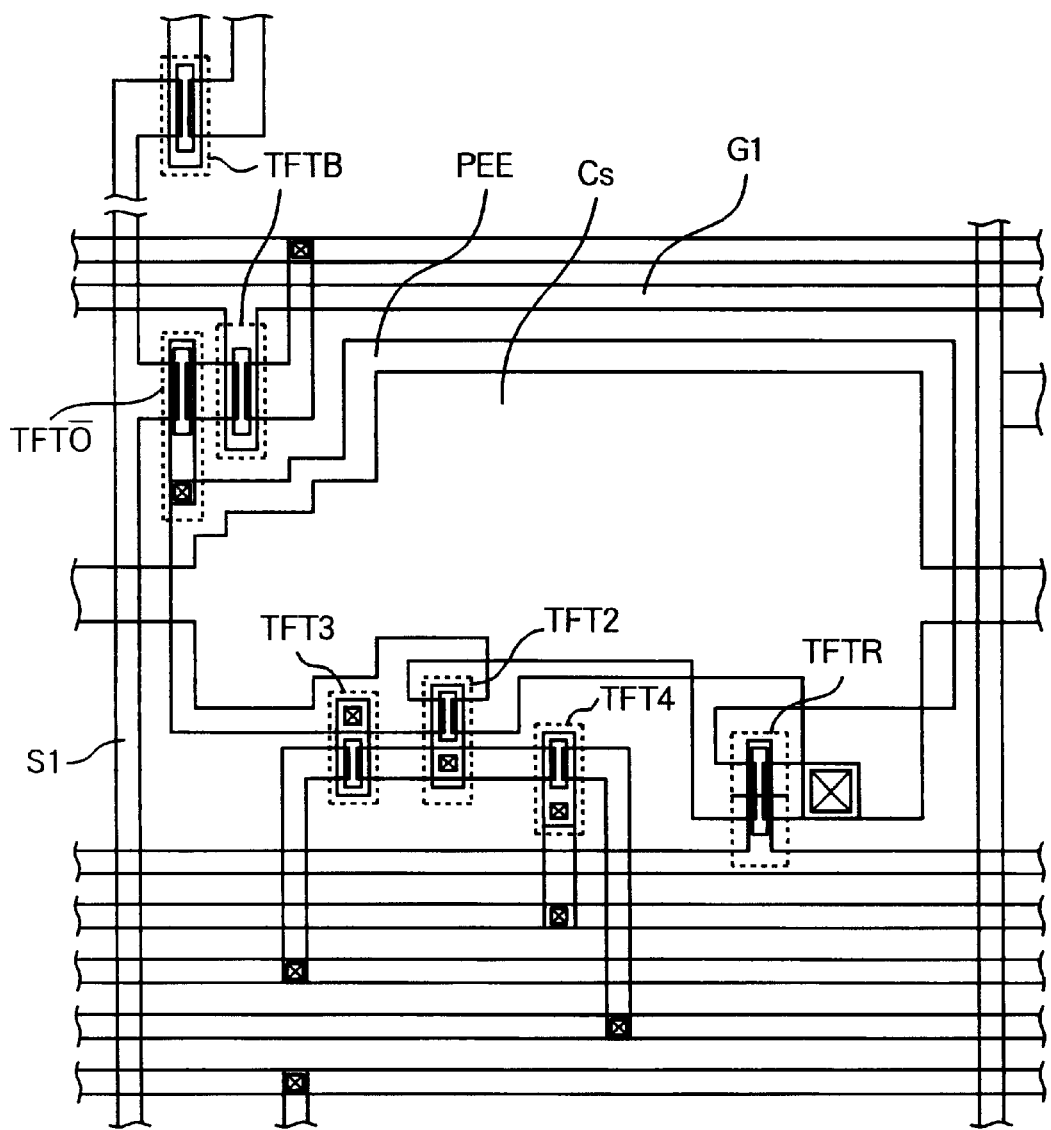
F I G. 12

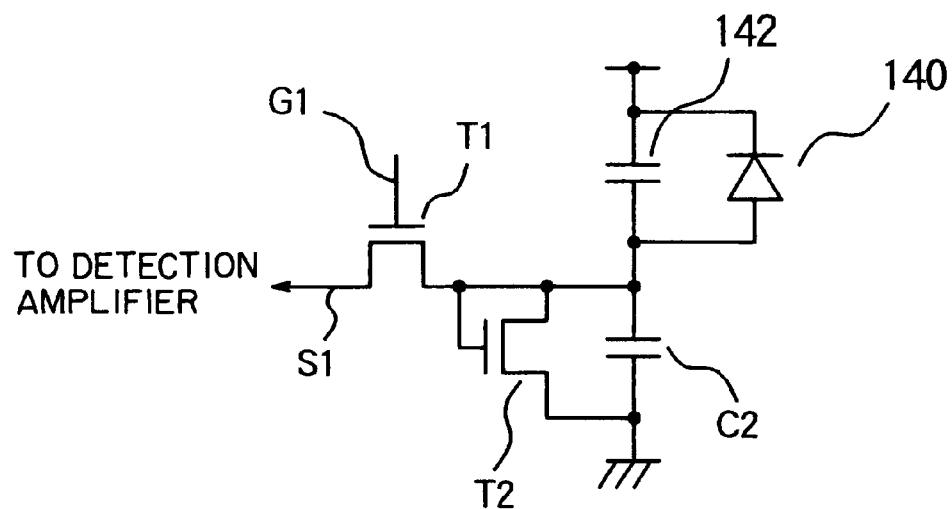
F I G. 15
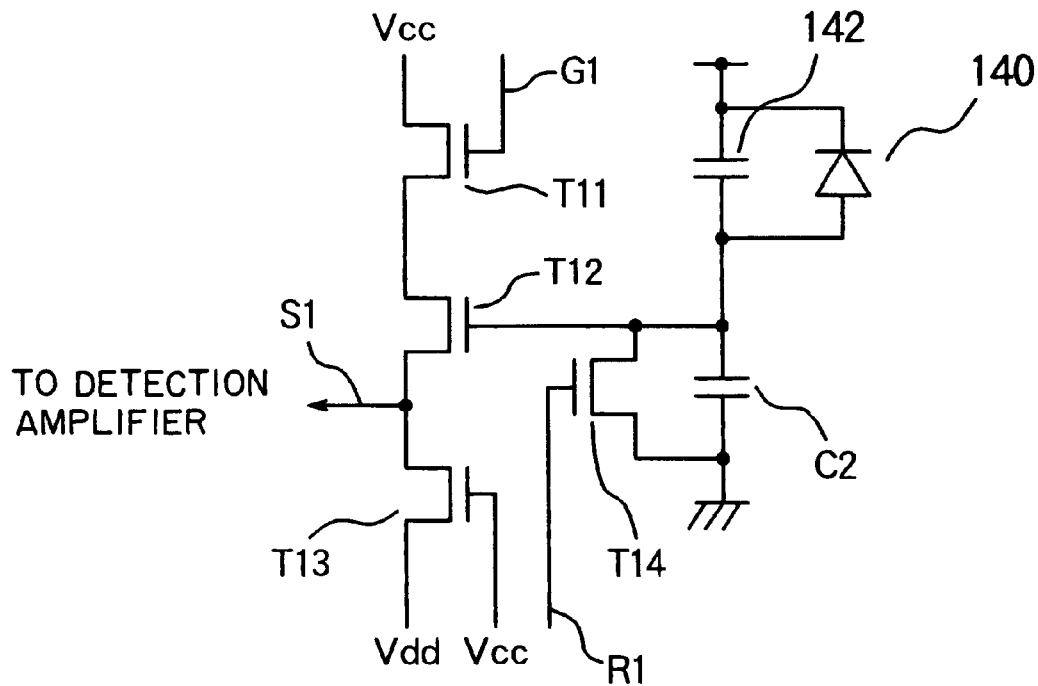
F I G. 16

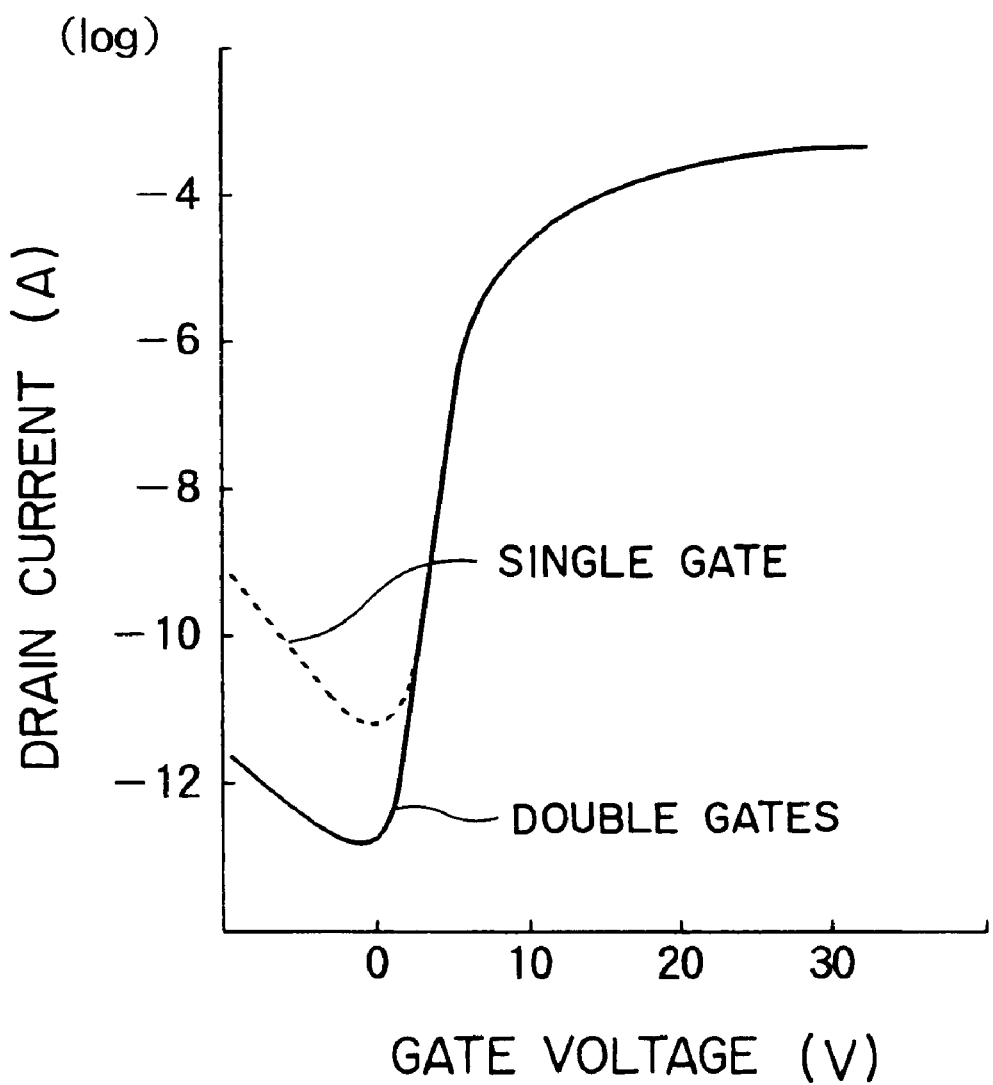
F I G. 18

IMAGE DETECTION DEVICE

BACKGROUND OF THE INVENTION

The present invention relates to an image detection device for converting a light signal into an electrical signal and, more particularly, to an image detection device suitable for a medical X-ray diagnostic apparatus.

In recent years, an X-ray diagnostic apparatus using an image detection device including an a-Si TFT (amorphous silicon Thin Film Transistor) has been proposed in, e.g., U.S. Pat. No. 4,689,487. FIG. 13 is a block diagram showing the whole arrangement of this image detection device.

X-rays are emitted from an X-ray source 101 to be incident on an a-Si TFT image detection device 103 through an object 102 to be examined. The image detection device 103 generates and outputs an analog electrical signal corresponding to the quantity of X-rays having passed through it. The analog electrical signal is input to an A/D converter 109 in time-series and converted into a digital signal, and the digital signal is stored in an image memory 106. The image memory 106 stores image data of one or several images, and sequentially stores image data supplied to specific addresses on the basis of a control signal from a controller 105. The image data stored in the image memory 106 is extracted and processed by an arithmetic processor 110, and the result is re-stored in the image memory 106. The arithmetic result stored in the image memory 106 is converted into an analog signal by a D/A converter 107 and displayed as an X-ray image on an image monitor 108.

The a-Si TFT image detection device 103 has an arrangement as shown in FIG. 14. The TFT array is made up of a 2,000×2,000 matrix of pixels (e1, 1) to (e2000, 2000). Individual pixels (ej, j) (j is an integer of 1 to 2,000) are parallel-connected at their two ends. One end of each pixel has a photoelectric conversion film 140 and pixel capacitor 142 to which a bias voltage from a power supply 148 is applied, and the other end has an a-Si TFT 144 having an input terminal connected to the other end of each of the photoelectric conversion film 140 and pixel capacitor 142, an output terminal connected to a signal line S1, and a gate connected to a scanning line G1.

When light is incident on the pixel, a current flows through the photoelectric conversion film 140 to accumulate charges in the capacitor 142. A scanning line driving circuit 152 drives the scanning lines G1 to turn on columns of the TFTs 144 whose gates are connected to themselves. Charges accumulated in the capacitor 142 having one end connected to the input terminal of each TFT 144 are transferred to an amplifier 154 via a signal line S1 connected to the output terminal of the TFT 144. The charge amount corresponds to a light quantity incident on the pixel, and the amplitude of an output signal from the amplifier 154 changes in accordance with the charge amount.

The output signal from the amplifier 154 is converted into a digital signal using an A/D converter (not shown) to display a digital image on a computer display. The pixel region shown in FIG. 14 has the same arrangement as a TFT liquid crystal display used in a compact information device such as a personal computer, and can be easily manufactured for a low-profile large display.

The arrangement shown in FIG. 14 has one TFT 144 per pixel. However, an actual device may have a plurality of TFTs 144 per pixel. For example, when charges accumulated in a given capacitor 142 are read out to a corresponding signal line S1 using a detective circuit having an arrangement as shown in FIG. 15, TFTs T1 and T2 are used. The TFT T1 is connected to the scanning line G1 at its gate and ON/OFF-controlled to output charges in the capacitor 142 to the signal line S1. The TFT T2 is connected between one end of the capacitor 142 and a ground terminal to operate as a protective diode.

Alternatively, a detective circuit shown in FIG. 16 is of an AMI (Amplified MOS Imager) type for converting charges into a voltage. The detective circuit includes TFTs T11 to T14, a constant current source made up of the TFTs T11 to T13 is connected between the capacitor 142 and the signal line S1, and the TFT T14 is connected as a reset transistor between one end of the capacitor 142 and a ground terminal. The gate of the TFT 14 receives a reset signal R1. The detective circuit shown in FIG. 15 directly reads out charges accumulated in the capacitor 142 to the signal line S1 via the TFT T1. To the contrary, the circuit shown in FIG. 16 converts charges in the capacitor 142 into a voltage to output the voltage.

High S/N ratios and wide dynamic ranges are required of X-ray image detection devices. For this reason, when a plurality of TFTs are formed in one pixel, their TFT characteristics must be made uniform. However, the TFT characteristics vary due to process variations. In particular, variations in OFF resistance and threshold voltage Vth degrade the image quality. Further, variations in OFF resistance increase the leakage current, resulting in large noise, a low S/N ratio, and a narrow dynamic range.

SUMMARY OF THE INVENTION

It is, therefore, an object of the present invention to provide an image detection device capable of realizing high image quality by suppressing the leakage current and increasing the S/N ratio.

An image detection device of the present invention comprises a signal line and scanning line which run perpendicularly to each other on a substrate, a pixel portion arranged at an intersection of the signal line and scanning line and including a photoelectric conversion film for converting incident light into a signal charge to accumulate the signal charge and a pixel electrode, a signal detective circuit including thin film transistors controlled in operation by the scanning line to read out a potential of the pixel electrode, and a scanning line driving circuit for driving the scanning line, wherein a thin film transistor having a source or drain connected to the pixel electrode out of the thin film transistors included in the signal detective circuit has an LDD structure on a high-potential side solely.

Even when pluralities of signal lines and scanning lines run on the substrate, pixel portions are arranged in a matrix at intersections of the signal lines and scanning lines, and the signal detective circuit includes thin film transistors controlled in operation by the respective scanning lines to read out potentials of corresponding pixel electrodes, the present invention can be applied. In this case, at least one thin film transistor having a source or drain connected to the pixel electrode out of the thin film transistors included in the signal detective circuit has an LDD structure on a high-potential side.

In the image detection device of the present invention, at least one transistor having a source or drain connected to the pixel electrode out of the thin film transistors included in the signal detective circuit has a multi-gate structure.

Alternatively, in the image detection device of the present invention, at least one transistor having a source or drain connected to the pixel electrode out of the thin film transistors included in the signal detective circuit has LDD structures on high- and low-potential sides in which an LDD length is larger on the high-potential side than the low-potential side.

When the signal detective circuit comprises a signal read transistor which has a drain or source connected to the pixel electrode, a source or drain connected to the signal line, and a gate connected to the scanning line, and is controlled in operation by the scanning line to output the potential of the pixel electrode to the signal line, and a protective transistor which has a drain or source and a gate connected to the pixel electrode, and a source or drain connected to a predetermined potential line, and connects the pixel electrode to the predetermined potential line when the potential of the pixel electrode reaches not less than a predetermined potential, the signal read transistor has an LDD structure on a high-potential side, and the protective transistor has an LDD structure on at least a high-potential side.

The signal read transistor and protective transistor can have a multi-gate structure.

Alternatively, the signal read transistor and protective transistor may have LDD structures on high- and low-potential sides in which the LDD-length is larger on the high-potential side than the low-potential side.

When the signal detective circuit comprises the signal read transistor, the protective transistor, and a threshold adjustment circuit including at least one transistor which receives a power supply voltage, has an input terminal connected to the pixel electrode and an output terminal connected to the gate of the protective transistor, and adjusts an operating threshold of the protective transistor in accordance with the potential of the pixel electrode, the signal read transistor and protective transistor have an LDD structure on a high-potential side.

The signal read transistor and protective transistor have a multi-gate structure, and the transistor included in the threshold adjustment circuit has a single-gate structure.

Alternatively, the signal read transistor and protective transistor have LDD structures on high- and low-potential sides in which the LDD length is larger on the high-potential side than the low-potential side.

When the signal detective circuit comprises the protective transistor, a reset transistor which has a drain or source connected to the pixel electrode, and a source or drain connected to a second predetermined potential terminal, and connects the pixel electrode to the second predetermined potential terminal when a gate receives a reset signal, and a voltage conversion circuit including at least one transistor which receives a power supply voltage, has an input terminal connected to the pixel electrode and an output terminal connected to the signal line, and generates a voltage signal corresponding to the potential of the pixel electrode to output the voltage signal to the signal line, the protective transistor and reset transistor have an LDD structure on a high-potential side.

The protective transistor and reset transistor have an LDD structure on a high-potential side.

The protective transistor and reset transistor have a multi-gate structure, and the transistor included in the voltage conversion circuit has a single-gate structure.

Alternatively, the protective transistor and reset transistor have LDD structures on high- and low-potential sides in which the LDD length is larger on the high-potential side than the low-potential side.

According to the image detection device, a TFT having an LDD structure on a high-potential side, a TFT having a multi-gate structure, or a TFT having LDD structures on high- and low-potential sides in which the LDD length is larger on the high-potential side than the low-potential side is employed for the signal read transistor having a source or drain connected to the pixel electrode. Thus, the image detection device can increase the OFF resistance to reduce the leakage current, and can prevent a decrease in S/N ratio owing to leakage of signal charges in the OFF state.

A TFT having an LDD structure on at least a high-potential side, a TFT having a multi-gate structure, or a TFT having LDD structures on high- and low-potential sides in which the LDD length is larger on the high-potential side than the low-potential side is employed for the protective transistor, thereby obtaining the same effects.

When a TFT having a single-gate structure is used for the transistor included in the threshold adjustment circuit or voltage conversion circuit, unlike the signal read transistor, protective transistor, or reset transistor, the drivability can be enhanced to increase the read sensitivity.

BRIEF DESCRIPTION OF THE DRAWINGS

FIG. 1 is a plan view showing the planar arrangement of one pixel in an image detection device according to the first embodiment of the present invention;

FIG. 2 is a circuit diagram showing the circuit arrangement of one pixel in the image detection device;

FIG. 5 is a sectional view showing the longitudinal sectional structure of a TFT having a double-gate structure that is used in an image detection device according to the second embodiment of the present invention;

FIG. 6 is a layout view when the circuit arrangement of one pixel in the image detection device according to the first or second embodiment is applied to the whole TFT array;

FIG. 10 is a circuit diagram showing the circuit arrangement of one pixel in the image detection device;

FIG. 12 is a layout view showing a modification of the image detection device according to the third or fourth embodiment;

FIG. 15 is a circuit diagram showing another circuit example of a signal detective circuit in the TFT image detection device of the apparatus;

FIG. 16 is a circuit diagram showing still another circuit example of the signal detective circuit in the TFT image detection device of the apparatus;

FIG. 18 is a graph showing changes in gate voltage vs. drain current in TFTs having different gate structures;

DESCRIPTION OF THE PREFERRED EMBODIMENTS

Embodiments of the present invention will be described below with reference to the accompanying drawings.

Figure 17:
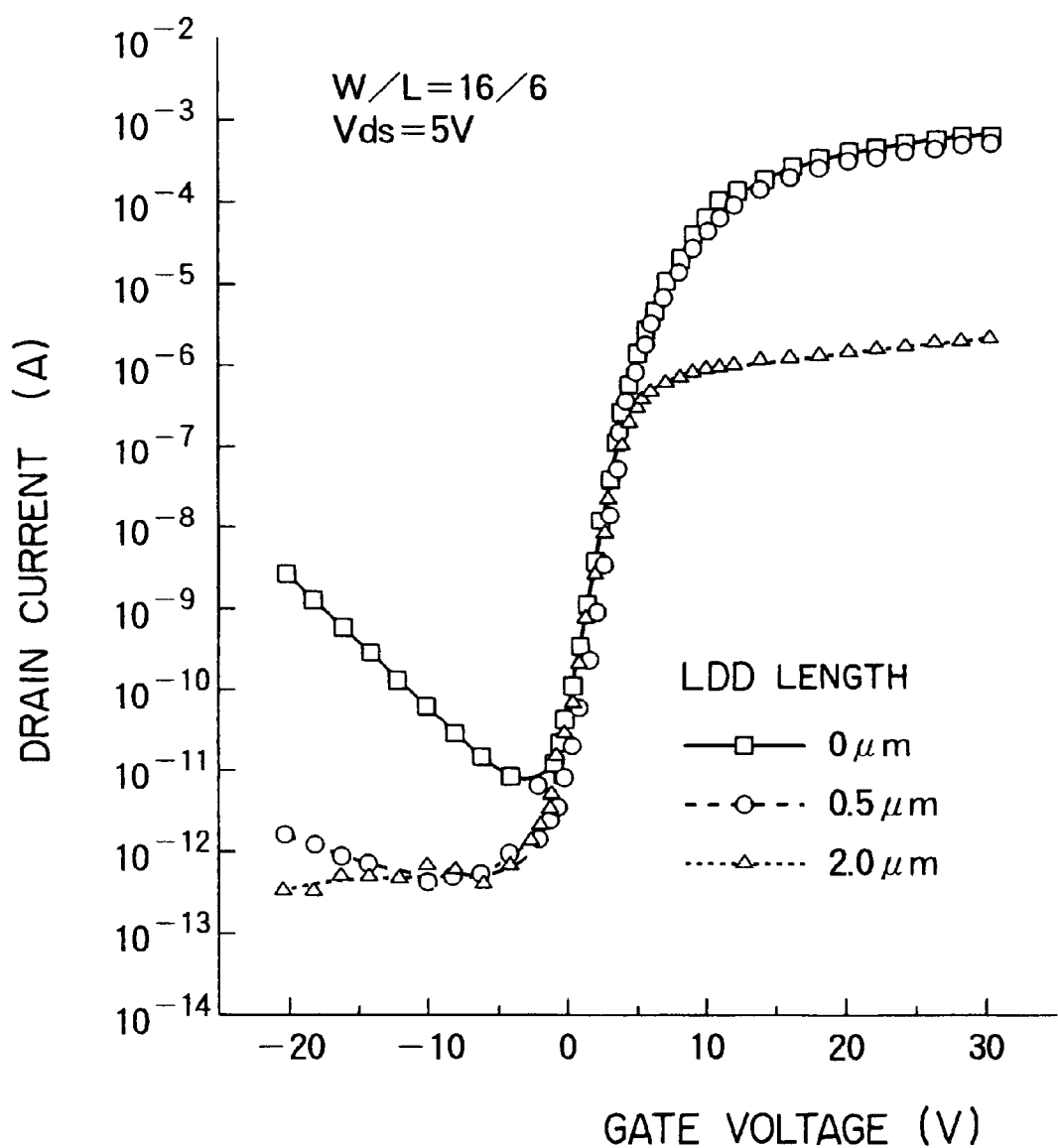
FIG. 17 is a graph showing changes in gate voltage vs. drain current in TFTs having different LDD lengths.

FIG. 17 shows changes in the I-V curve of a gate voltage V and drain current I when the LDD length is different between TFTs having an LDD (Lightly Doped Drain) structure. This graph reveals that a large LDD length reduces the OFF current. This is because the region extending from the channel region to the drain region is a lightly doped region and reduces a high electric field. By adopting TFTs having the LDD structure and setting a large LDD length, the leakage current in the OFF state can be reduced.

However, a large LDD length tends to increase the resistance value and decrease the ON current in the ON state.

Thus, a TFT having a large LDD length is employed for a TFT whose OFF current should be reduced, and a TFT having a small LDD length is employed for a TFT which requires a large ON current.

Figure 19:
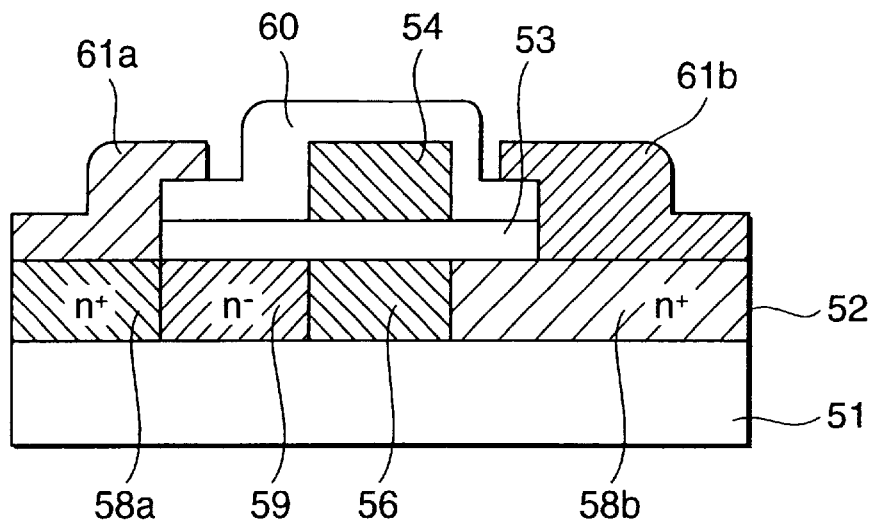
FIG. 19 is a sectional view showing the longitudinal sectional structure of a TFT having an LDD structure on the high-potential side.

If, however, a TFT whose OFF current should be reduced has a large LDD length, the pixel opening ratio drops to decrease the sensitivity of the image detection device. Therefore, a TFT structure capable of preventing a decrease in sensitivity and reducing the OFF current is required. FIG. 19 shows the longitudinal sectional structure of this TFT.

A semiconductor layer 52 made of a polysilicon film or the like is formed on an insulating substrate 51, a gate electrode 54 is formed on the semiconductor layer 52 via a gate insulating film 53, and an insulating film 60 is formed on the gate electrode 54. In the semiconductor layer 52, a channel region 56 is defined at a position where the channel region 56 faces the gate electrode 54 via the gate insulating film 53. A lightly doped drain region (LDD region) 59 is formed on only one side (high-electric-potential side) of the channel region 56, and heavily doped regions 58a and 58b corresponding to a source and drain are formed on the outer sides of the LDD region 59 and channel region 56. The heavily doped regions 58a and 58b correspond to contact portions, and electrodes 61a and 61b are formed on the surfaces of the heavily doped regions 58a and 58b.

Figure 20:
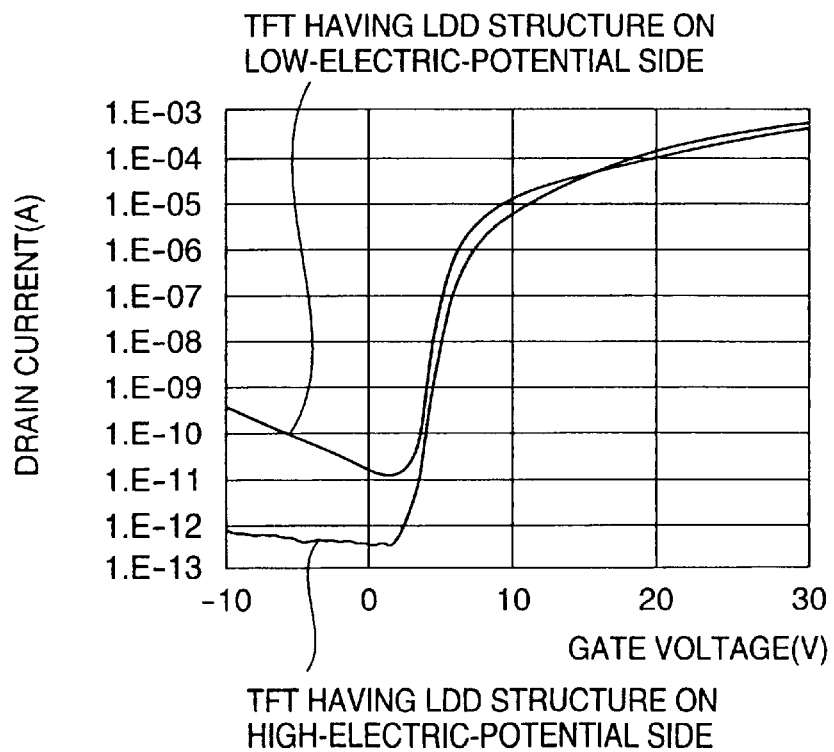
FIG. 20 is a graph showing the gate voltage vs. drain current curve of a TFT having an LDD structure on the high-potential side in comparison with the gate voltage vs. drain current curve of a TFT having an LDD structure on the low-potential side.

FIG. 20 shows the I-V curve of the drain current and gate voltage in a TFT having an LDD structure on the high-potential side in comparison with the I-V curve of the drain current and gate voltage in a TFT having an LDD structure on the low-potential side. The comparison result reveals that the TFT having an LDD structure on the high-potential side can reduce the leakage current in the OFF state more greatly than other TFTs having an LDD structure on one side.

The TFT having an LDD structure on only the high-potential side can reduce the device size and area more greatly than a TFT having LDD structures equal in LDD length on both the high- and low-potential sides. The area of the electrode pixel can be increased by using this TFT having an LDD structure on only the high-potential side for a TFT whose OFF current should be reduced. Consequently, the accumulation capacity of the pixel increases to improve the sensitivity of the image detection device.

Figure 21:
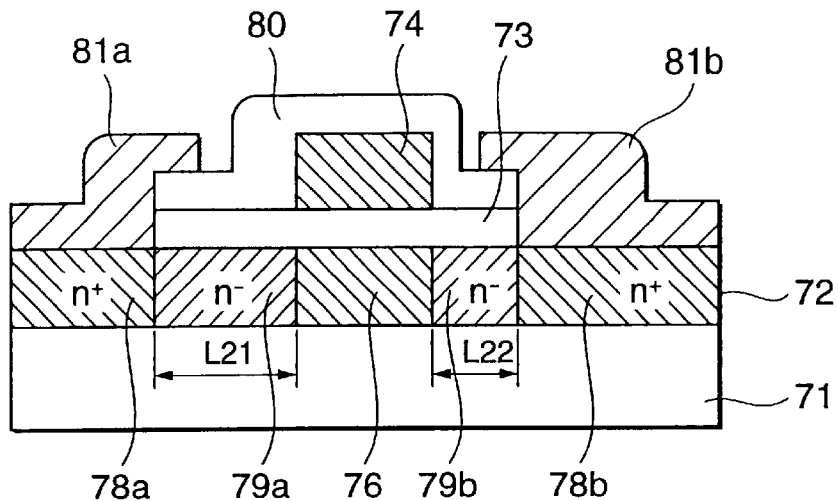
FIG. 21 is a sectional view showing the longitudinal sectional structure of a TFT having LDD structures on the high- and low-potential sides in which the LDD length is larger on the high-potential side than the low-potential side.

Instead, a TFT having LDD structures on the high- and low-potential sides in which the LDD length is larger on the high-potential side than the low-potential side may be used. FIG. 21 shows the longitudinal sectional structure of this TFT.

A semiconductor layer 72 made of a polysilicon film or the like is formed on an insulating substrate 71, a gate electrode 74 is formed on the semiconductor layer 72 via a gate insulating film 73, and an insulating film 80 is formed on the gate electrode 74. In the semiconductor layer 72, a channel region 76 is defined at a position where the channel region 76 faces the gate electrode 74 via the gate insulating film 73. LDD regions 79a and 79b are formed on the two sides of the channel region 76, and heavily doped regions 78a and 78b corresponding to a source and drain are formed on the outer sides of the LDD regions 79a and 79b. The heavily doped regions 78a and 78b correspond to contact portions, and electrodes 81a and 81b are formed on the surfaces of the heavily doped regions 78a and 78b.

Of the LDD regions 79a and 79b, an LDD length L2 of the LDD region 79a on the high-potential side is set larger than an LDD length L22 of the LDD region 79b on the low-potential side.

Figure 22:
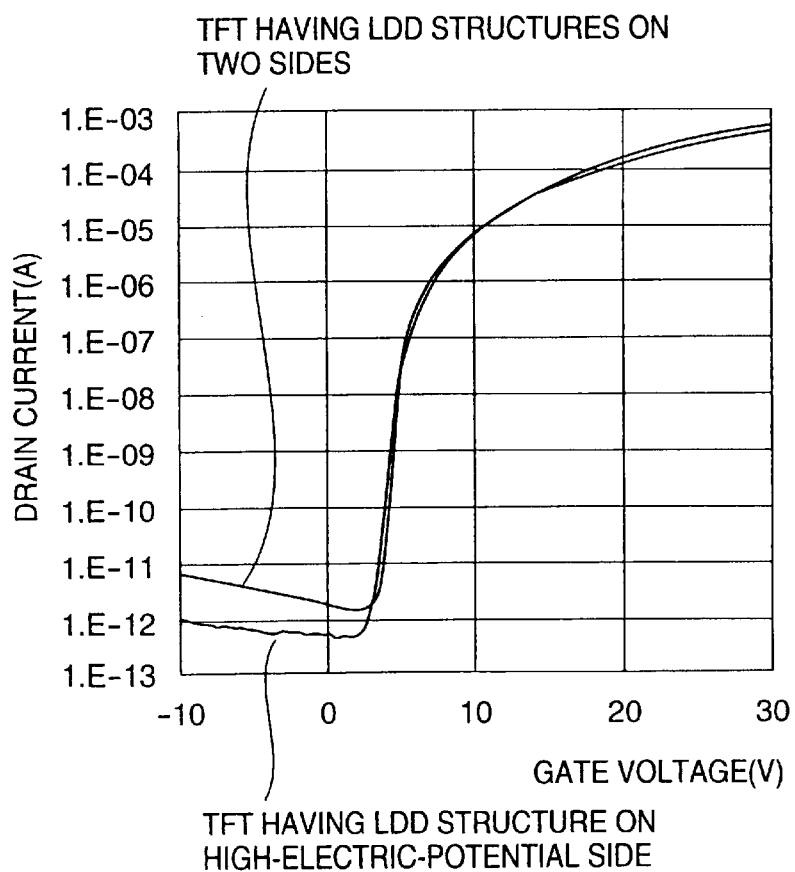
FIG. 22 is a graph showing the gate voltage vs. drain current curve of a TFT having an LDD structure with an LDD length of 5 μm on the high-potential side in comparison with the gate voltage vs. drain current curve of a TFT having LDD structures each with an LDD length of 2.5 μm on the high- and low-potential sides.

FIG. 22 shows the I-V curve of a TFT having an LDD region with an LDD length of 5 μm on only the high-potential side in comparison with the I-V curve of a TFT having 2.5-μm long LDD regions on the high- and low-potential sides. As is apparent from this graph, the TFT having a 5-μm long LDD region on only the high-potential side can more greatly reduce the leakage current in the OFF state.

Although these TFTs have the same total length of the LDD region, the TFT having an LDD region on only the high-potential side can more greatly reduce the leakage current. That is, the leakage current can be reduced more greatly by forming an LDD region on the high-potential side than by forming an LDD region on the low-potential side.

In view of the foregoing, an embodiment of the present invention adopts a TFT having a large LDD length for a TFT whose OFF current should be reduced, and a TFT having a relatively small LDD length for a TFT which requires a large ON current, out of a plurality of TFTs formed in one pixel. To reduce the OFF current and increase the pixel opening ratio, a TFT having an LDD region on only the high-potential side or a TFT having LDD regions on the high- and low-potential sides in which the LDD length is larger on the high-potential side is adopted for a TFT whose OFF current should be reduced out of a plurality of TFTs formed in one pixel.

In the present invention, the LDD structure means a structure having a lightly doped region in a TFT having this lightly doped region in only a source or drain.

TFTs can be classified into a single-gate structure and a double-gate structure. FIG. 18 shows the I-V curves of these TFTs. As is apparent from the graph, a TFT having a double-gate structure can more greatly reduce the OFF current. This is because the effective value of the leakage current is determined by a TFT exhibiting the smallest OFF current among all of a plurality of TFTs series-connected in an equivalent circuit, and variations in OFF current are suppressed even if a TFT with poor characteristic exists.

However, if the TFT having a double-gate structure has the same channel length as the TFT having a single-gate structure, the total channel length is doubled to decrease the ON current. Furthermore, the TFT having a double-gate structure is more complicated in manufacturing process than the TFT having a single-gate structure. Hence, the single-gate structure should be employed for a TFT which requires a large ON current.

To this end, another embodiment of the present invention adopts the double-gate structure for a TFT whose OFF current should be reduced, and the single-gate structure for a TFT which requires a large ON current, out of a plurality of TFTs formed in one pixel.

FIG. 1 shows the planar structure of one pixel in the TFT array of an image detection device according to the first embodiment of the present invention. FIG. 2 shows the circuit arrangement of one pixel in the first embodiment. In this embodiment, two TFT1 and TFT2 are formed in one pixel having a pixel capacitor Cs and photoelectric conversion film OEF.

TFT1 is formed as a signal charge read switch, has a source and drain connected between a node ND1 connected to one end (pixel electrode) of the pixel capacitor Cs and a signal line S1, and a gate connected to a scanning line G1, and is ON/OFF-controlled by the scanning line G1. One end (Cs electrode) of the pixel capacitor Cs is grounded via a node ND2. When the scanning line G1 changes to high level (e.g., 20 V) to turn on TFT1, the signal charges accumulated in the pixel capacitor Cs are read out to the signal line S1 and transferred to a detector (not shown).

TFT2 is formed as a protective diode, and has a gate and drain connected to the node ND1 and a source connected to a bias line B1. The bias line B1 is kept at a constant potential Vb to control the breakdown voltage of TFT2 serving as a protective diode. When the electrode potential of the pixel capacitor Cs, i.e., the potential of the node ND1 rises to a predetermined potential or more, e.g., 10 V or more, TFT2 is turned on to flow signal charges to the bias line B1. In this way, TFTs protect the pixel electrode from application of a predetermined voltage or more.

Figure 3:
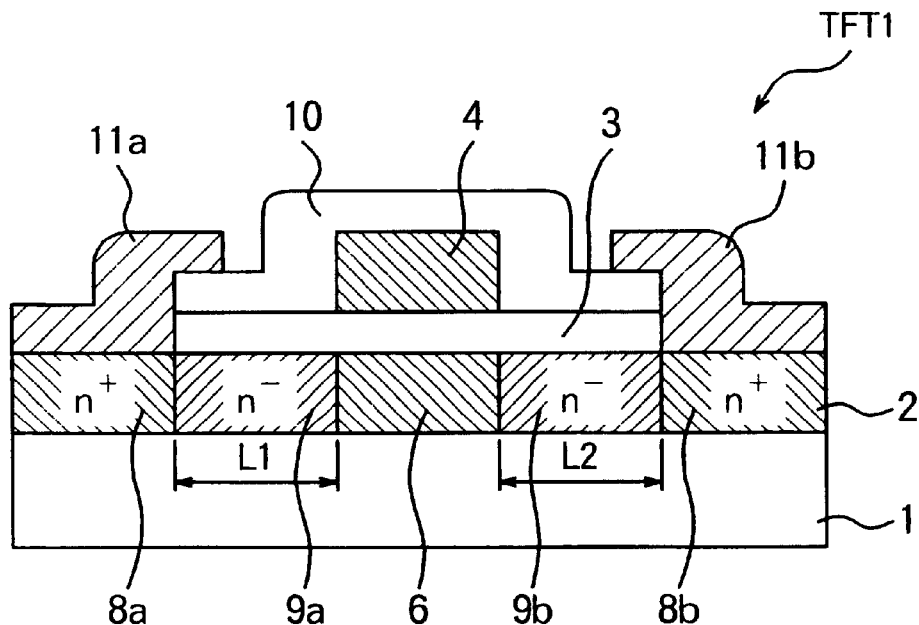
FIG. 3 is a sectional view showing the longitudinal sectional structure of a TFT having a small LDD length that is used in the image detection device.
Figure 4:
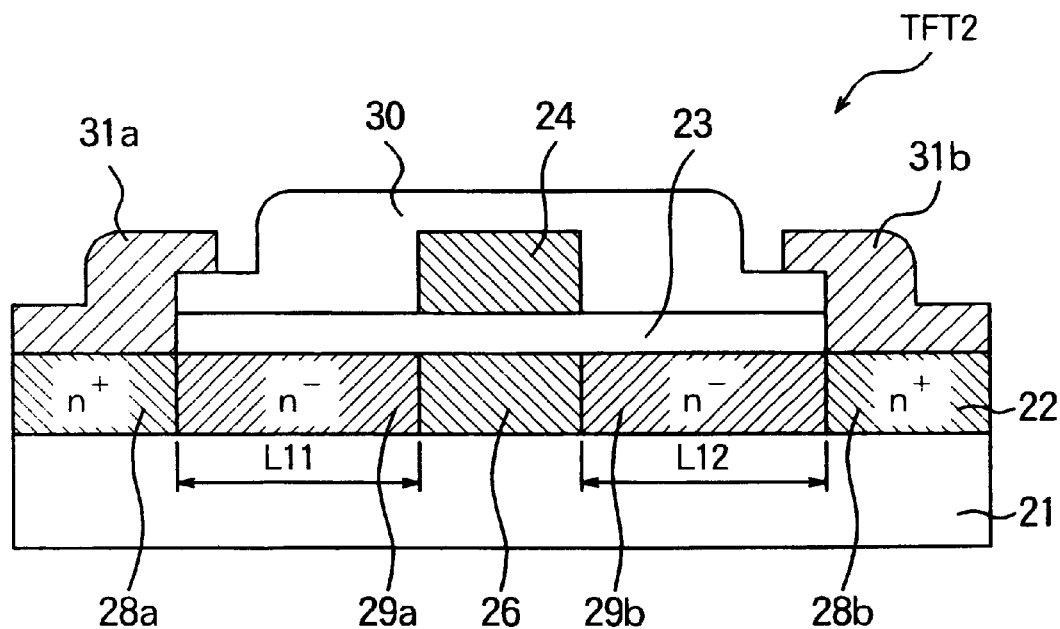
FIG. 4 is a sectional view showing the longitudinal sectional structure of a TFT having a large LDD length that is used in the image detection device.

In the first embodiment, two TFT1 and TFT2 are formed per pixel, and they have large LDD lengths. FIGS. 3 and 4 show the longitudinal sectional structures of TFTs having different LDD lengths. In FIG. 3, a semiconductor layer 2 made of a polysilicon film is formed on an insulating substrate 1, a gate electrode 4 is formed on the semiconductor layer 2 via a gate insulating film 3, and an insulating film is formed on the gate electrode 4. In the semiconductor layer 2, a channel region 6 is defined at a position where the channel region 6 faces the gate electrode 4 via the gate insulating film 3. Lightly doped regions (LDD region) 9a and 9b are formed on the two sides of the channel region 6, and heavily doped regions 8a and 8b corresponding to a source and drain are formed on the outer sides of the LDD regions 9a and 9b. The heavily doped regions 8a and 8b correspond to contact portions, and electrodes 11a and 11b are on the surfaces of the heavily doped regions 8a and 8b.

In a TFT shown in FIG. 4, a semiconductor layer 22 made of a polysilicon film is formed on an insulating substrate 21, a gate electrode 24 is formed on the semiconductor layer 22 via a gate insulating film 23, and an insulating film 30 is formed on the gate electrode 24. In the semiconductor layer 22, a channel region 26 is defined at a position where the channel region 26 faces the gate electrode 24 via the gate insulating film 23. Lightly doped regions (LDD regions) 29a and 29b are formed on the two sides of the channel region 26, and heavily doped regions 28a and 28b are formed on the outer sides of the LDD regions 29a and 29b. Electrodes 31a and 31b are in the heavily doped regions 28a and 28b.

The LDD length L11+L12 of the LDD regions 29a and 29b in the TFT shown in FIG. 4 is longer than the LDD length L1+L2 of the LDD regions 9a and 9b in the TFT shown in FIG. 3. The first embodiment uses TFTs having a large LDD length, like the one shown in FIG. 4, for TFT1 and TFT2. Especially, if the protective diode TFT2 exhibits a small LDD length and a low OFF resistance, charges photoelectrically converted by the photoelectric conversion film OEF and accumulated in the pixel capacitor Cs leak in the protective diode TFT2 to decrease the signal charge accumulation amount before the charges are transferred to the signal line S1 by changing the scanning line G1 to high level. Also, if the signal read transistor TFT1 exhibits a low OFF resistance, signal charges flow to the signal line S1 before being read out by changing the scanning line G1 to high level, and the signal charge accumulation amount decreases to decrease the S/N ratio. For this reason, the first embodiment uses TFTs having a large LDD length and a high OFF resistance for TFT1 and TFT2, thereby reducing the leakage current in the OFF state and increasing the S/N ratio.

As described above, to increase the pixel opening ratio and reduce the OFF current, a TFT having an LDD structure on only the high-potential side, like the one shown in FIG. 19, is desirably used for TFT1 formed as a signal charge read switch.

Alternatively, a TFT having LDD structures on the high- and low-potential sides in which the LDD length is larger on the high-potential side than the low-potential side, like the one shown in FIG. 21, may be used for TFT1 formed as a signal charge read switch.

A TFT having an LDD structure on only the high-potential side or a TFT having LDD structures on both the high- and low-potential sides may be used for TFT2 formed as a protective diode, similar to TFT1. Instead, a TFT having LDD regions on the high- and low-potential sides in which the LDD length is larger on the high-potential side may be used.

Figure 23:
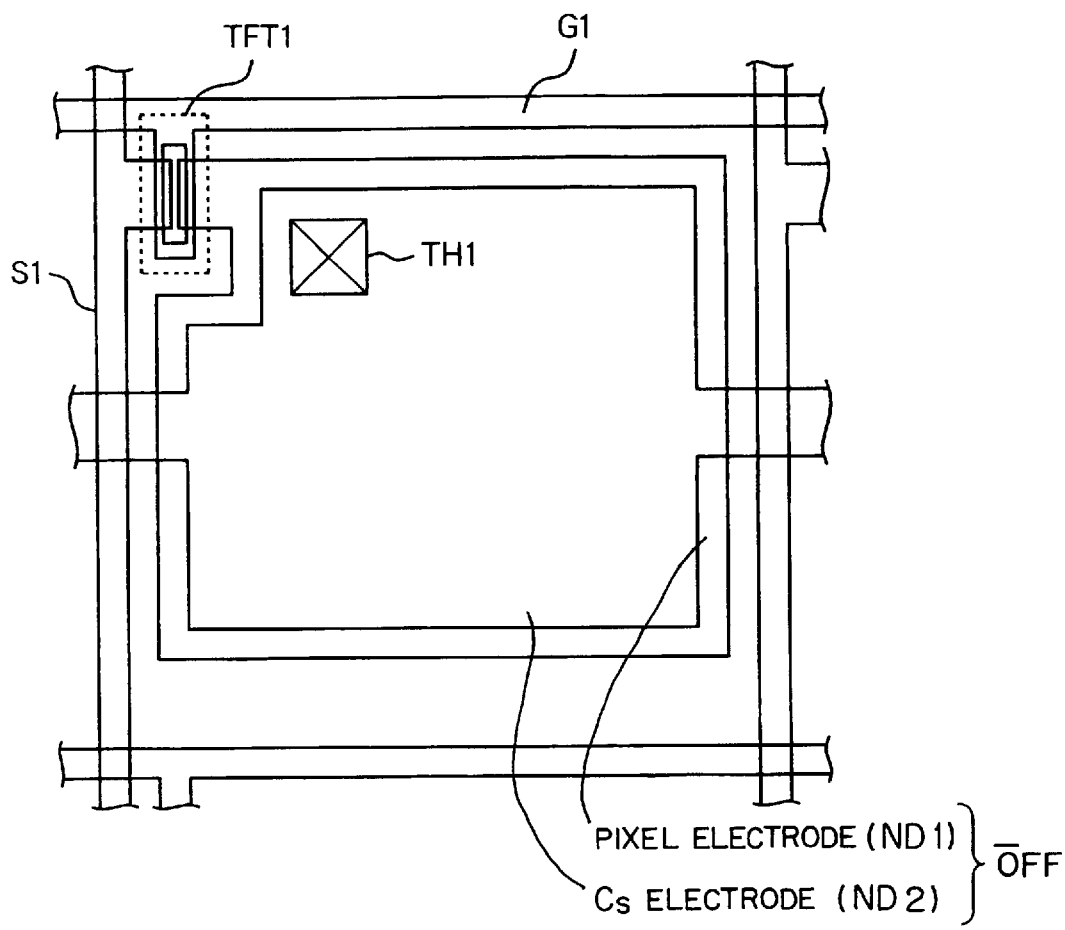
FIG. 23 is a plan view showing the planar arrangement of one pixel when no protective diode is used in the image detection device according to the first embodiment shown in FIG. 1.
Figure 24:
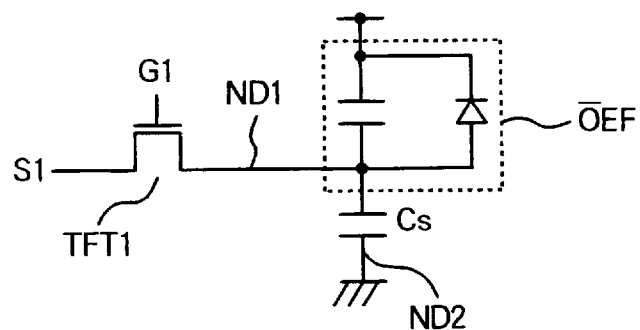
FIG. 24 is a circuit diagram showing the circuit arrangement of one pixel in the image detection device shown in FIG. 23.

The TFT array shown in FIGS. 1 and 2 comprises not only TFT1 serving as a signal charge read switch but also TFT2 serving as a protective diode. However, TFT2 need not always be formed. FIG. 23 shows the planar structure of the TFT array in this case, and FIG. 24 shows the circuit arrangement of one pixel.

Similar to the TFT array shown in FIG. 1, TFT1 is formed as a signal charge read switch, has a source and drain connected between the node ND1 connected to one end (pixel electrode) of the pixel capacitor Cs and the signal line S1, and a gate connected to the scanning line G1, and is ON/OFF-controlled by the scanning line G1.

This device has one TFT1 per pixel. As described above, to increase the pixel opening ratio and reduce the OFF current, a TFT having an LDD structure on only the high-potential side, like the one shown in FIG. 19, is used for TFT1. Alternatively, a TFT, like the one shown in FIG. 21, having LDD structures on the high- and low-potential sides in which the LDD length is larger on the high-potential side than the low-potential side may be used for TFT1.

In the image detection device, the high- and low-potential sides of the TFT are fixed. In a liquid crystal display device, the high- and low-potential sides of the TFT formed in the pixel are exchanged every video signal write cycle in order to perform AC driving. However, in the TFT formed in the pixel in the image detection device, one of the source and drain always serves as a high-potential side. For example, in the circuit shown in FIG. 24, signal charges photoelectrically converted are accumulated in the pixel capacitor Cs. Then, the node ND1 connected to one terminal of TFT1 changes to a higher potential than the ground potential. To the contrary, the signal line S1 connected to the other terminal of TFT1 remains at the ground potential. When TFT1 is turned on, signal charges accumulated in the pixel capacitor Cs flow into the signal line S1 via the node ND1 and TFT1. During the read period, the node ND1 drops to the ground potential, whereas the signal line S1 only transfers signal charges and does not change from the ground potential. When TFT1 is turned off, signal charges build up in the pixel capacitor Cs again, and the potential of the node ND1 rises from the ground potential. Thus, the high-potential side of TFT1 can be defined as a side always connected to the node ND1.

The second embodiment of the present invention is characterized by using TFTs having a double-gate structure, like the one shown in FIG. 5, for the signal read TFT1 and protective diode TFT2 shown in FIGS. 1 and 2. In this TFT, a semiconductor layer 32 made of a polysilicon film is formed on an insulating substrate 31, gate electrodes 34a and 34b are formed on the semiconductor layer 32 via a gate insulating film 33, and an insulating film 40 is formed on the gate electrodes 34a and 34b. In the semiconductor layer 32, channel regions 36a and 36b are defined at positions where they respectively face the gate electrodes 34a and 34b via the gate insulating film 33. LDD regions 39a and 39b are formed on the outer sides of the channel regions 36a and 36b, and an LDD region 39c is formed between the channel regions 36a and 36b. Heavily doped regions 28a and 28b are formed on the outer sides of the LDD regions 39a and 39b. Electrodes 41a and 41b are in the heavily doped regions 38a and 38b.

In this manner, TFTs having a double-gate structure are employed for the signal read switch TFT1 and protective diode TFT2, i.e., TFTs having a source or drain connected to the pixel electrode node ND1 of the pixel capacitor Cs. The total LDD length of the LDD regions 39a, 39b, and 39c and the OFF resistance increase to decrease the leakage current. The second embodiment can also attain the same effects as in the first embodiment. The second embodiment has exemplified a TFT having a double-gate structure. However, the number of gates is not limited to two, and even a TFT having a multi-gate structure with three or more gates can increase the total LDD length and OFF resistance to obtain the same effects.

The first embodiment reduces the leakage current by setting a large LDD length for the protective diode and signal read transistor, and the second embodiment reduces the leakage current in the OFF state by adopting a TFT having a double-gate structure. Alternatively, the leakage current in the OFF state is reduced by adopting a TFT which has an LDD region on only the high-potential side or a TFT larger in LDD length on the high-potential side for the signal read transistor, and a TFT having an LDD region on at least the high-potential side for the protective diode. However, the present invention is not limited to this, and the same effects can also be obtained by decreasing the size W/L of the transistor given by the ratio of a channel width W to a channel length L.

In the first and second embodiments, the semiconductor film is a polysilicon film but may be an a-Si semiconductor film or single-crystal silicon film.

The left and right LDD regions 29a and 29b shown in FIG. 4 or the LDD regions 39a and 39c shown in FIG. 5 have the same length but may have different lengths.

An application of the arrangement of one pixel according to the first or second embodiment to the whole TFT array will be described with reference to FIG. 6. m (m is an integer of 2 or more) scanning lines S1, S2, . . . , Sm and n signal lines G1, G2, . . . , Gn run perpendicularly to each other, and pixel electrodes P(1,1), . . . , P(m,n) of pixel capacitors form a matrix at the intersections of the scanning lines and signal lines. In each pixel, the signal read switch TFT1 has two ends connected between the pixel electrode P(i, j) (i is an integer of 2 to m, and j is an integer of 2 to n) and the signal line S1, and a gate connected to the scanning line Gj. The protective diode TFT2 has two ends connected between the pixel electrode P(i,j) and bias power supply Pw, and a gate connected to the pixel electrode P(i,j).

By applying the first embodiment, a TFT having a large LDD length, a TFT having an LDD region on the high-potential side, or a TFT larger in LDD length on the high-potential side than the low-potential side may be used for the signal charge read switch TFT1 formed in each of pixels forming a matrix, and a TFT having an LDD structure on at least the high-potential side maybe used for the protective diode TFT2. By applying the second embodiment, TFTs having a double-gate structure may be used for the signal charge read switch TFT1 and protective diode TFT2. Alternatively, TFTs having a small size W/L may be used for TFT1 and TFT2. This arrangement can reduce the leakage current in the OFF state and increase the S/N ratio on the whole TFT array.

Figure 7:
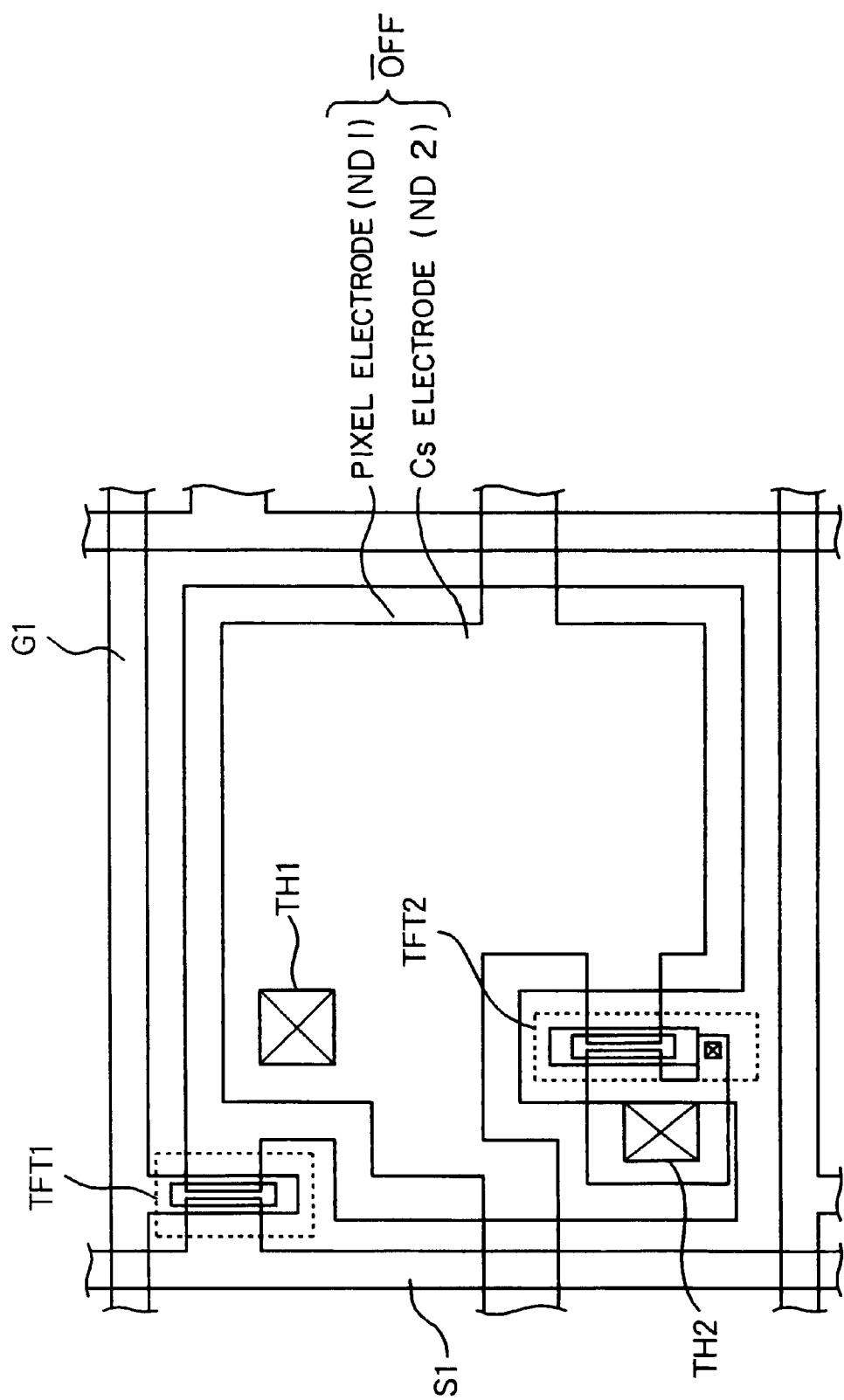
FIG. 7 is a layout view showing a modification of the image detection device according to the first or second embodiment.

In the circuit arrangements shown in FIGS. 1, 2, and 6, the source of the protective diode TFT2 is connected to the bias line B1 to receive the bias voltage. Instead, as shown in FIG. 7, the source of the protective diode TFT2 may be connected to the Cs electrode of the pixel capacitor Cs. In this case, a predetermined voltage such as the ground voltage is applied to the pixel capacitor Cs. The arrangement of one pixel shown in FIG. 7 may be applied to the whole TFT array.

In the circuit arrangements shown in FIGS. 1, 2, 6, and 7, the protective diode TFT2 is constituted by one TFT. However, as shown in FIGS. 8A to 8E, the protective diode TFT2 may be constituted by a plurality of TFTs Tr1 to Trx. In the protective diode shown in FIG. 8A, the drains and sources of the TFTs Tr1 to Trx are series-connected between the node ND1 and bias line B1 and all the gates are commonly connected to the node ND1. In the protective diode shown in FIG. 8B, the drains and sources of the TFTs Tr1 to Trx are similarly series-connected between the node ND1 and bias line B1 but the gates are connected to the drains of the respective TFTs Tr1 to Trx.

Figure 8:
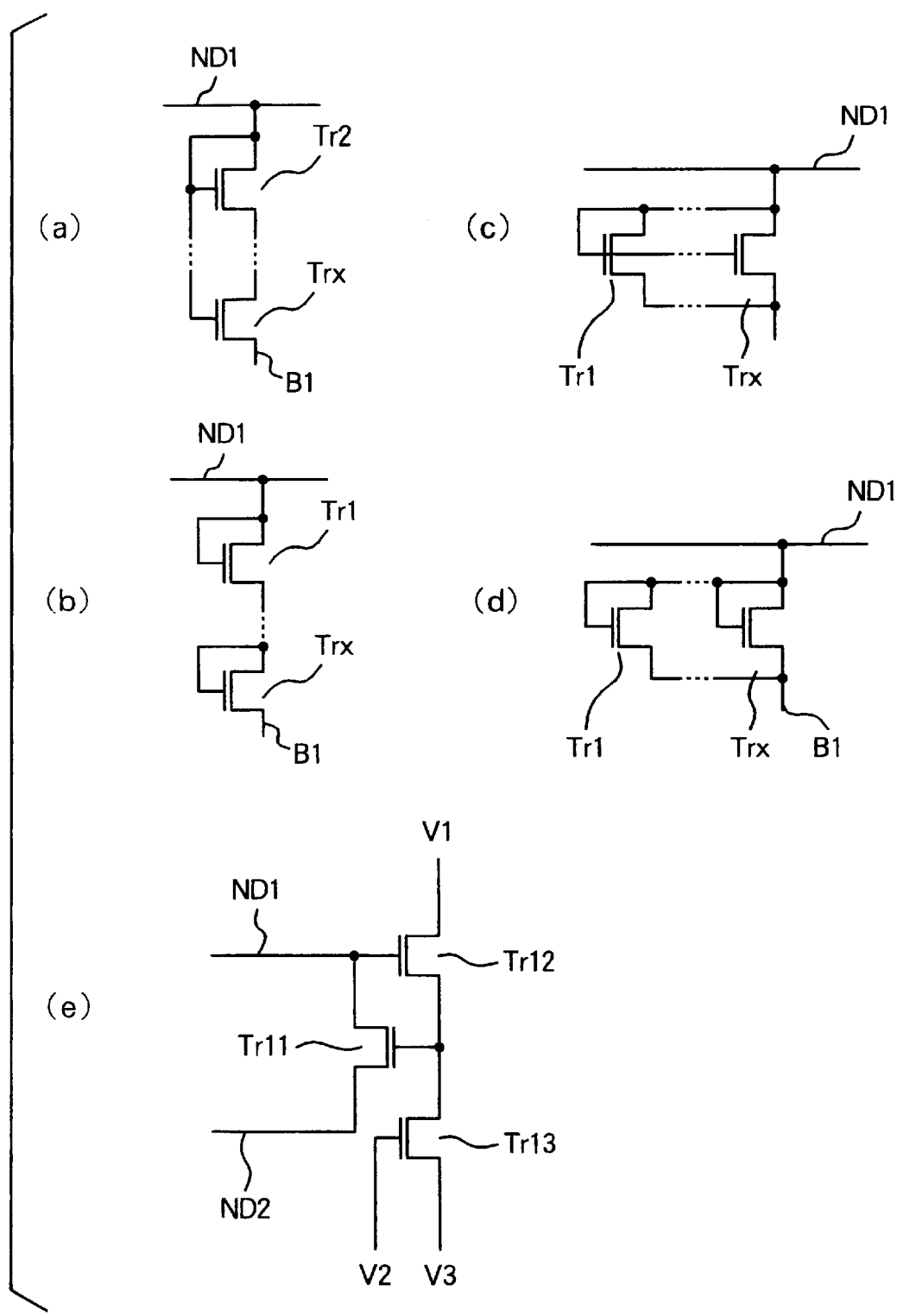
FIG. 8 is a circuit diagram showing a modification of a protective diode in the image detection device according to the first or second embodiment.

In the protective diode shown in FIG. 8C, the drains and sources of the TFTs Tr1 to Trx are parallel-connected between the node ND1 and bias line B1 and all the gates are commonly connected to the node ND1. In the protective diode shown in FIG. 8D, the drains and sources of the TFTs Tr1 to Trx are similarly parallel-connected between the node ND1 and bias line B1 but the gates are connected to the drains of the respective TFTs Tr1 to Trx.

The protective circuit shown in FIG. 8E has TFTs Tr11 to Tr13 connected between the nodes ND1 and ND2 shown in FIG. 2. The drain and source of the TFT Tr11 serving as a protective diode are connected between the nodes ND1 and ND2. The drains and sources of the TFTs Tr12 and Tr13 for adjusting the threshold voltage of the protective diode TFT Tr11 are series-connected. The TFT Tr12 has a drain to which a predetermined voltage V1 is applied, a gate connected to the node ND1, and a source connected to the gate of the TFT Tr11 and the drain of the TFT Tr13. A predetermined voltage V3 is applied to the source of the TFT Tr13, and a predetermined voltage V2 is applied to its gate. By changing the voltages V1 to V3, the threshold of the protective diode TFT Tr11 can be adjusted in accordance with the pixel electrode potential.

When the first embodiment is applied to a circuit using the protective circuit shown in FIG. 8E, TFTs having a large LDD length are employed for the protective diode TFT Tr11 and signal read switch TFT1, and TFTs having a relatively small LDD length are employed for the threshold adjustment TFTs Tr12 and Tr13. Alternatively, a TFT having an LDD structure on only the high-potential side or a TFT larger in LDD length on the high-potential side is employed for the protective diode TFT Tr11.

When the second embodiment is applied, TFTs having a double-gate structure or multi-gate structure are adopted for the protective diode TFT Tr11 and signal read switch TFT1, and TFTs having a single-gate structure are adopted for the threshold adjustment TFTs Tr12 and Tr13. This is because it is preferable in terms of characteristics to decrease the ON resistance rather than to increase the OFF resistance as for the threshold adjustment TFTs Tr12 and Tr13, compared to the protective diode TFT Tr11 and signal read switch TFT1.

Figure 9:
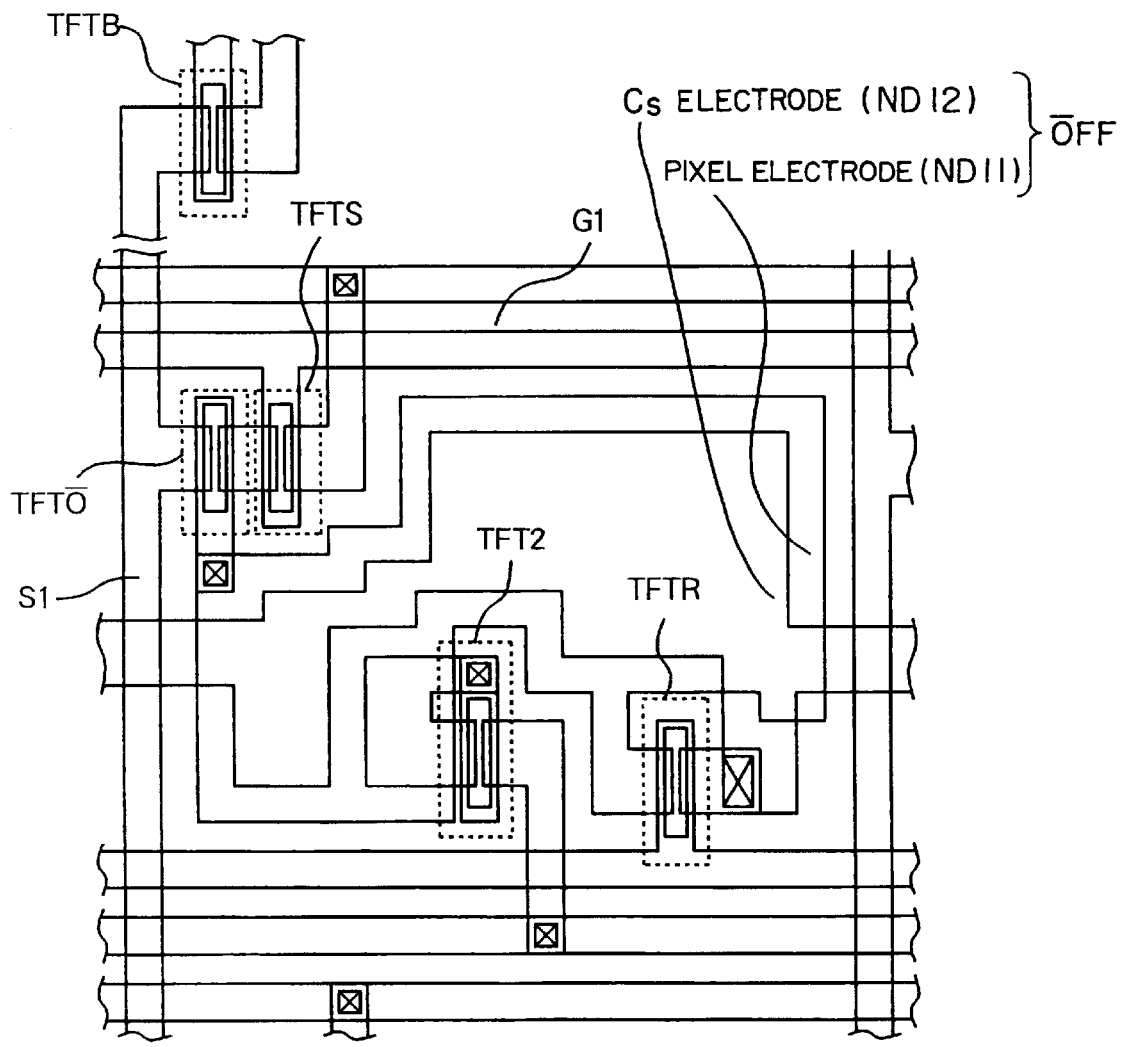
FIG. 9 is a plan view showing the planar arrangement of one pixel in an image detection device according to the third or fourth embodiment of the present invention.

The third embodiment of the present invention will be described with reference to FIG. 9 showing the planar structure and FIG. 10 showing the circuit arrangement. In the first and second embodiments, charges accumulated in the pixel capacitor Cs are directly transferred to the signal line S1 via the signal read switch TFT1. To the contrary, the third embodiment employs the AMI scheme in which signal charges accumulated in the pixel capacitor Cs are converted into a voltage signal by a voltage conversion circuit VC to transfer the voltage signal to the signal line S1.

A photoelectric conversion film OEF has one end connected to a power supply terminal, and the other end connected to the pixel electrode of the pixel capacitor Cs via a node ND1. The Cs electrode of the pixel capacitor Cs is grounded. A reset TFT TFTR has a drain and source connected between the node N1 and ground terminal, and a gate for receiving a reset signal. A protective diode TFT2 has a drain and gate connected to the node ND1, and a source connected to a bias line B1.

The voltage conversion circuit VC is interposed between the node ND1 and signal line S1. The voltage conversion circuit VC comprises a selection TFT TFTS having a drain connected to the power supply terminal, a source connected to the drain of TFTO, and a gate connected to a scanning line G1, an output TFT TFTO having a source connected to the signal line S1 and a gate connected to the node ND1, and a bias TFT TFTB having a drain and gate connected to the power supply terminal and a source connected to the signal line S1.

The signal line S1 is biased to a predetermined bias potential by the bias TFTB. If the signal line S1 changes to high level, the selection TFT TFTS is turned on to supply the power supply voltage to the drain of TFTO, and a voltage corresponding to the signal charge of a corresponding pixel is read out. A potential Vgs of a pixel electrode connected to the gate of the transistor TFTO via the node ND1 is output from the source of TFTO and transferred to the signal line S1. After that, a high-level reset signal R is input to the gate of the reset TFT TFTR to turn on the reset TFT TFTR, and charges left in the pixel capacitor Cs are removed to reset the pixel electrode potential.

The protective diode TFT2 receives a predetermined bias potential Vb from the bias line B1 connected to the source. The potential Vb controls the breakdown voltage of the protective diode TFT2. If the pixel electrode potential Vgs reaches a predetermined voltage or more, e.g., 10 V or more, the protective diode TFT2 is turned on to dissipate signal charges to the bias line B1. This prevents dielectric breakdown by application of a predetermined voltage or more to the pixel electrode.

The third embodiment is characterized in that the protective diode TFT2 and reset TFT TFTR each having a source or drain connected to the pixel electrode (node ND1) are larger in LDD length than TFTB, TFTS, and TFTO. If the OFF resistances of the protective diode TFT2 and reset TFT TFTR are low, signal charges leak before being read out, and the S/N ratio falls. For this reason, TFTs having a large LDD length are adopted for TFT2 and TFTR to reduce the leakage current and increase the S/N ratio. On the other hand, TFTB, TFTS, and TFTO constituting the voltage conversion circuit VC must have a low ON resistance and satisfactory drivability so as not to narrow the band due to a small amplitude of a voltage to be output to the signal line S1. Hence, TFTs having a small LDD length are adopted for TFTB, TFTS, and TFTO.

Alternatively, TFTs having an LDD structure on only the high-potential side or TFTs larger in LDD length on the high-potential side may be adopted for the protective diode TFT2 and reset TFT TFTR.

The fourth embodiment of the present invention has the same circuit arrangement as the third embodiment shown in FIGS. 9 and 10 except for the TFT structure. TFTs having a multi-gate structure are employed for a protective diode TFT2 and reset TFT TFTR each having a source or drain connected to the pixel electrode, whereas TFTs having a single-gate structure are employed for TFTB, TFTS, and TFTO. Since the protective diode TFT2 and reset TFT TFTR must have a high OFF resistance, as described above, TFTs having a multi-gate structure which provides a large total LDD length are used. To the contrary, TFTs having a single-gate structure are used for TFTB, TFTS, and TFTO constituting a voltage conversion circuit VC in order to enhance the drivability.

The fourth embodiment is not limited to TFTs having different LDD lengths or gate structures, but may employ TFTs having a small size W/L for the protective diode TFT2 and reset TFT TFTR, and TFTs having a large size for TFTB, TFTS, and TFTO forming the voltage conversion circuit VC, as described in the first and second embodiments.

Moreover, the semiconductor film in the TFT is not limited to a polysilicon film and may be an a-Si semiconductor film or single-crystal silicon film.

The right and left LDD regions of the TFT may be different in length.

Figure 11:
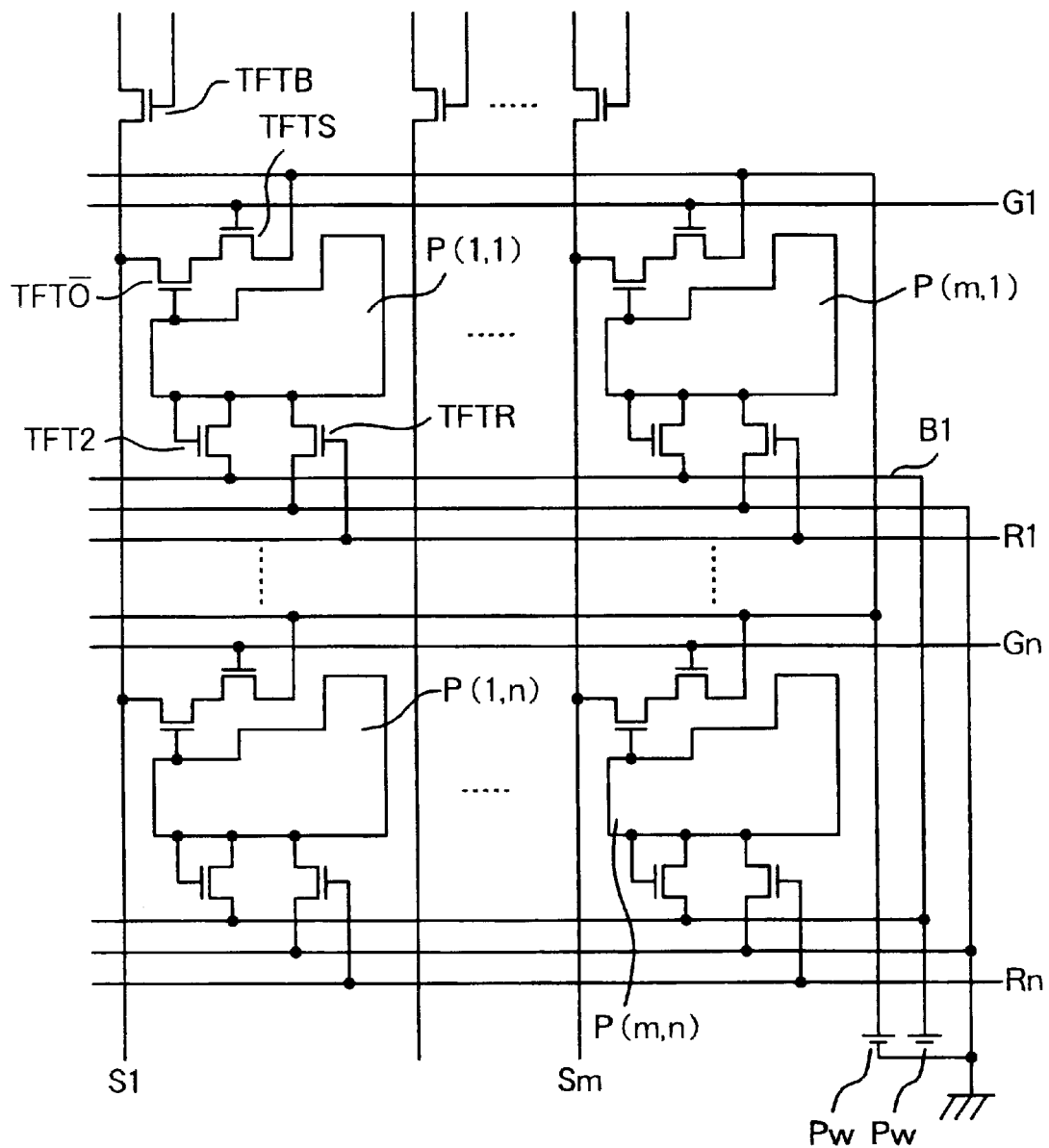
FIG. 11 is a layout view when the circuit arrangement of one pixel in the image detection device according to the third or fourth embodiment is applied to the whole TFT array.
Figure 13:
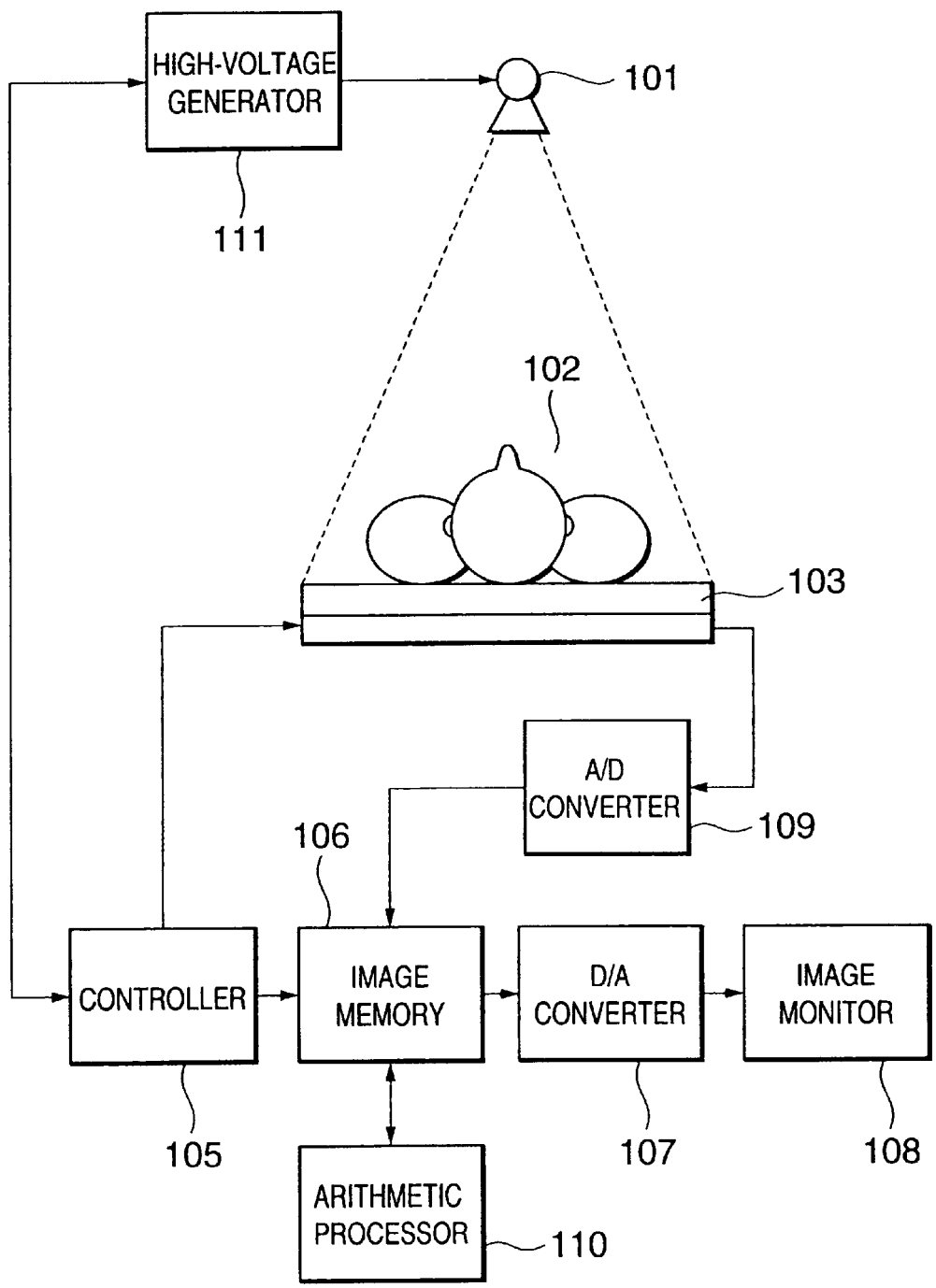
FIG. 13 is a block diagram showing the schematic arrangement of a conventional X-ray diagnostic apparatus.
Figure 14:
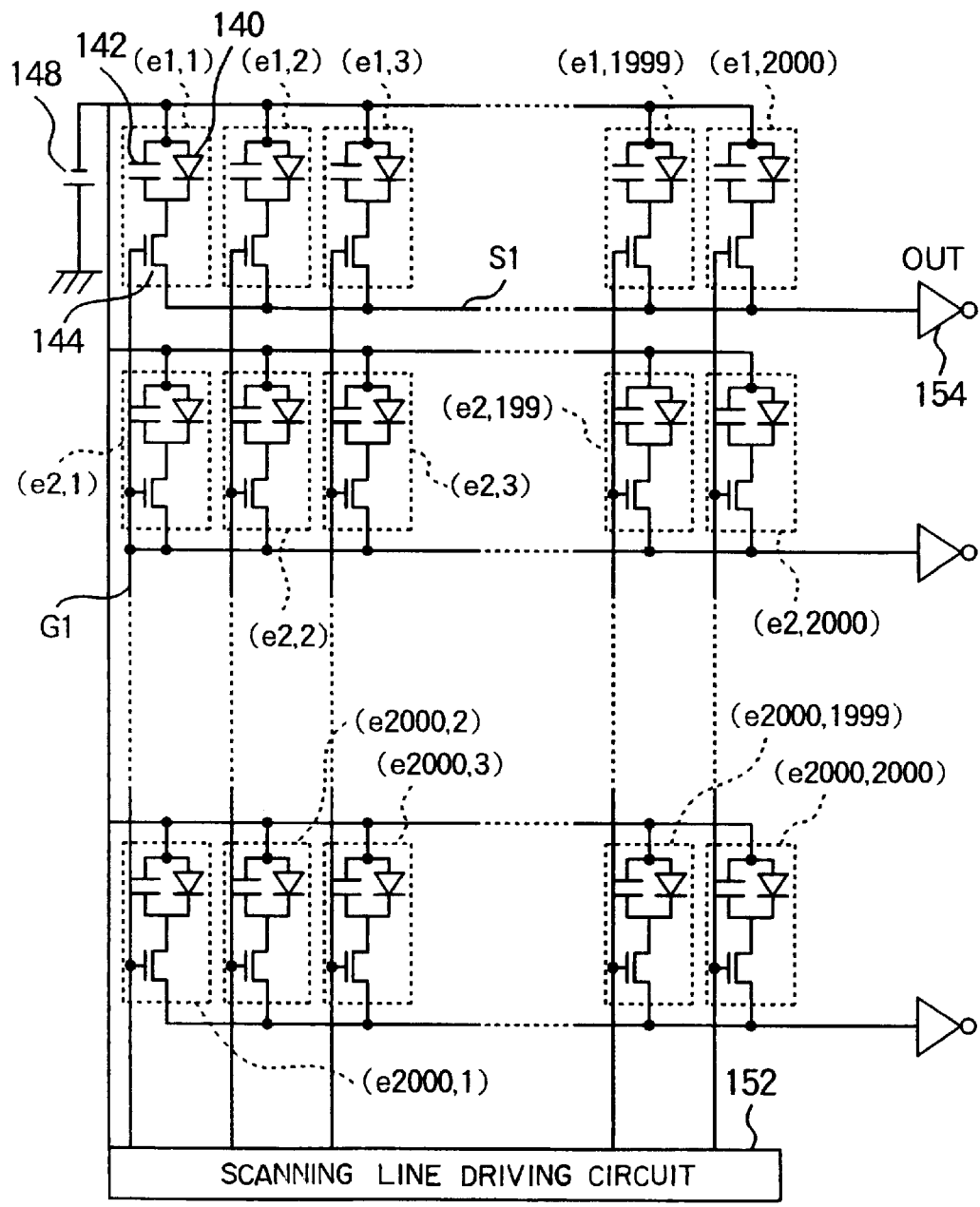
FIG. 14 is a circuit diagram showing the arrangement of a TFT image detection device in the apparatus.

An application of the arrangement of one pixel according to the third or fourth embodiment to the whole TFT array will be described with reference to FIG. 11. m scanning lines S1, S2, . . . , Sm and n signal lines G1, G2, . . . , Gn run perpendicularly to each other, and pixel electrodes P(1,1), . . . , P(m,n) of pixel capacitors form a matrix at the intersections of the scanning lines and signal lines. The voltage conversion circuit VC made up of TFTB, TFTS, and TFTO is interposed between the pixel electrode P(i,j) and signal line S1 every pixel. The protective diode TFT2 has two ends connected between the pixel electrode P(i,j) and bias power supply Pw, and a gate connected to the pixel electrode P(i,j). The reset TFT TFTR has two ends connected between the pixel electrode P(i,j) and ground terminal, and a gate connected to a reset line R1.

By applying the third embodiment, TFTs having different LDD lengths may be used for TFTB, TFTS, TFTO, protective diode TFT2, and reset TFT TFTR formed in each of pixels arranged in a matrix. By applying the fourth embodiment, TFTs having different gate structures may be used. Alternatively, TFTs having a small size W/L may be used for TFT1 and TFT2. This arrangement can reduce the leakage current in the OFF state and increase the S/N ratio on the whole TFT array.

In the third and fourth embodiments, the source of the protective diode TFT2 is connected to the bias line B1 to receive the bias voltage. Instead, as shown in FIG. 12, the source of the protective diode TFT2 may be connected to the Cs electrode of the pixel capacitor Cs. In this case, a predetermined voltage such as the ground voltage is applied to the pixel capacitor Cs. The arrangement of one pixel shown in FIG. 12 may be applied to the whole TFT array.

In the circuit arrangements shown in FIGS. 9 to 12, the protective diode TFT2 has one TFT. However, as described in the first and second embodiments, the protective diode TFT2 may have a plurality of TFTs Tr1 to Trx shown in FIGS. 8A to 8E. The connection relationship between the sources, drains, and gates of the TFTs Tr1 to Trx, the nodes N1 and N2, and the bias line B1 is the same as in the first and second embodiments.

What is claimed is:

1. An image detection device comprising:
a signal line and scanning line which run perpendicularly to each other on a substrate; a pixel portion arranged at an intersection of said signal line and scanning line and including a photoelectric conversion film for converting incident light into a signal charge to accumulate the signal charge and a pixel electrode; a signal detective circuit including thin film transistors controlled in operation by said scanning line to read out a potential of the pixel electrode; and a scanning line driving circuit for driving said scanning line,
wherein a thin film transistor having a source or drain connected to the pixel electrode out of the thin film transistors included in said signal detective circuit has an LDD structure on a high-potential side solely,
wherein pluralities of signal lines and scanning lines run on the substrate, pixel portions are arranged in a matrix at intersections of said signal lines and scanning lines, said signal detective circuit includes thin film transistors controlled in operation by the respective scanning lines to read out potentials of corresponding pixel electrodes, and at least one thin film transistor having a source or drain connected to said pixel electrode out of the thin film transistors included in said signal detective circuit has an LDD structure on a high-potential side,
wherein said signal detective circuit comprises:
a signal read transistor which has a drain or source connected to the pixel electrode, a source or drain connected to said signal line, and a gate connected to said scanning line, and is controlled in operation by said scanning line to output the potential of the pixel electrode to said signal line; and
a protective transistor which has a drain or source and a gate connected to the pixel electrode, and a source or drain connected to a predetermined potential line, and connects the pixel electrode to the predetermined potential line when the potential of the pixel electrode reaches not less than a predetermined potential,
said signal read transistor having an LDD structure on a high-potential side, and said protective transistor having an LDD structure on at least a high-potential side.

2. An image detection device comprising:
a signal line and scanning line which run perpendicularly to each other on a substrate; a pixel portion arranged at an intersection of said signal line and scanning line and including a photoelectric conversion film for converting incident light into a signal charge to accumulate the signal charge and a pixel electrode; a signal detective circuit including thin film transistors controlled in operation by said scanning line to read out a potential of the pixel electrode; and a scanning line driving circuit for driving said scanning line,
wherein a thin film transistor having a source or drain connected to the pixel electrode out of the thin film transistors included in said signal detective circuit has a multi-gate structure,
wherein said signal detective circuit comprises:
a signal read transistor which has a drain or source connected to the pixel electrode, a source or drain connected to said signal line, and a gate connected to said scanning line, and is controlled in operation by said scanning line to output the potential of the pixel electrode to said signal line; and
a protective transistor which has a drain or source and a gate connected to the pixel electrode, and a source or drain connected to a predetermined potential line, and connects the pixel electrode to the predetermined potential line when the potential of the pixel electrode reaches not less than a predetermined potential,
said signal read transistor and protective transistor having a multi-gate structure.

3. An image detection device comprising:
a signal line and scanning line which run perpendicularly to each other on a substrate; a pixel portion arranged at an intersection of said signal line and scanning line and including a photoelectric conversion film for converting incident light into a signal charge to accumulate the signal charge and a pixel electrode; a signal detective circuit including thin film transistors controlled in operation by said scanning line to read out a potential of the pixel electrode; and a scanning line driving circuit for driving said scanning line,
wherein a thin film transistor having a source or drain connected to the pixel electrode out of the thin film transistors included in said signal detective circuit has a multi-gate structure,
wherein pluralities of signal lines and scanning lines run on the substrate, pixel portions are arranged in a matrix at intersections of said signal lines and scanning lines, said signal detective circuit includes thin film transistors controlled in operation by the respective scanning lines to read out potentials of corresponding pixel electrodes, and at least one thin film transistor having a source or drain connected to said pixel electrode out of the thin film transistors included in said signal detective circuit has a multi-gate structure, wherein said signal detective circuit comprises:
- a signal read transistor which has a drain or source connected to the pixel electrode, a source or drain connected to said signal line, and a gate connected to said scanning line, and is controlled in operation by said scanning line to output the potential of the pixel electrode to said signal line; and
- a protective transistor which has a drain or source and a gate connected to the pixel electrode, and a source or drain connected to a predetermined potential line, and connects the pixel electrode to the predetermined potential line when the potential of the pixel electrode reaches not less than a predetermined potential, said signal read transistor and protective transistor having a multi-gate structure.

4. An image detection device comprising:
a signal line and scanning line which run perpendicularly to each other on a substrate; a pixel portion arranged at an intersection of said signal line and scanning line and including a photoelectric conversion film for converting incident light into a signal charge to accumulate the signal charge and a pixel electrode; a signal detective circuit including thin film transistors controlled in operation by said scanning line to read out a potential of the pixel electrode; and a scanning line driving circuit for driving said scanning line, wherein a thin film transistor having a source or drain connected to the pixel electrode out of the thin film transistors included in said signal detective circuit has LDD structures on high- and low-potential sides in which an LDD length is larger on the high-potential side than the low-potential side, wherein said signal detective circuit comprises:
- a signal read transistor which has a drain or source connected to the pixel electrode, a source or drain connected to said signal line, and a gate connected to said scanning line, and is controlled in operation by said scanning line to output the potential of the pixel electrode to said signal line; and
- a protective transistor which has a drain or source and a gate connected to the pixel electrode, and a source or drain connected to a predetermined potential line, and connects the pixel electrode to the predetermined potential line when the potential of the pixel electrode reaches not less than a predetermined potential, said signal read transistor and protective transistor having LDD structures on high- and low-potential sides in which an LDD length is larger on the high-potential side than the low-potential side.

5. An image detection device comprising:
a signal line and scanning line which run perpendicularly to each other on a substrate; a pixel portion arranged at an intersection of said signal line and scanning line and including a photoelectric conversion film for converting incident light into a signal charge to accumulate the signal charge and a pixel electrode; a signal detective circuit including thin film transistors controlled in operation by said scanning line to read out a potential of the pixel electrode; and a scanning line driving circuit for driving said scanning line, wherein a thin film transistor having a source or drain connected to the pixel electrode out of the thin film transistors included in said signal detective circuit has LDD structures on high- and low-potential sides in which an LDD length is larger on the high-potential side than the low-potential side, wherein pluralities of signal lines and scanning lines run on the substrate, pixel portions are arranged in a matrix at intersections of said signal lines and scanning lines, said signal detective circuit includes thin film transistors controlled in operation by the respective scanning lines to read out potentials of corresponding pixel electrodes, and at least one thin film transistor having a source or drain connected to said pixel electrode out of the thin film transistors included in said signal detective circuit has LDD structures on high- and low-potential sides in which the LDD length is larger on the high-potential side than the low-potential side, wherein said signal detective circuit comprises:
- a signal read transistor which has a drain or source connected to the pixel electrode, a source or drain connected to said signal line, and a gate connected to said scanning line, and is controlled in operation by said scanning line to output the potential of the pixel electrode to said signal line; and
- a protective transistor which has a drain or source and a gate connected to the pixel electrode, and a source or drain connected to a predetermined potential line, and connects the pixel electrode to the predetermined potential line when the potential of the pixel electrode reaches not less than a predetermined potential, said signal read transistor and protective transistor having LDD structures on high- and low-potential sides in which an LDD length is larger on the high-potential side than the low-potential side.

6. An image detection device comprising:
a signal line and scanning line which run perpendicularly to each other on a substrate; a pixel portion arranged at an intersection of said signal line and scanning line and including a photoelectric conversion film for converting incident light into a signal charge to accumulate the signal charge and a pixel electrode; a signal detective circuit including thin film transistors controlled in operation by said scanning line to read out a potential of the pixel electrode; and a scanning line driving circuit for driving said scanning line, wherein said signal detective circuit comprises:
- signal read transistor which has a drain or source and gate connected to the pixel electrode, a source or drain connected to said signal line, and a gate connected to said scanning line, and is controlled in operation by said scanning line to output the potential of the pixel electrode to said signal line;
- a protective transistor which has a drain or source connected to the pixel electrode, and a source or drain connected to a predetermined potential line, and connects the pixel electrode to the predetermined potential line when the potential of the pixel electrode reaches not less than a predetermined potential; and
- a threshold adjustment circuit including at least one transistor which receives a power supply voltage, has an input terminal connected to the pixel electrode and an output terminal connected to the gate of said protective transistor, and adjusts an operating threshold of said protective transistor in accordance with the potential of the pixel electrode, said signal read transistor and protective transistor having an LDD structure on a high-potential side.

7. An image detection device comprising:

a signal line and scanning line which run perpendicularly to each other on a substrate;

a pixel portion arranged at an intersection of said signal line and scanning line and including a photoelectric conversion film for converting incident light into a signal charge to accumulate the signal charge and a pixel electrode;

a signal detective circuit; and a scanning line driving circuit for driving said scanning line, wherein pluralities of signal lines and scanning lines run on the substrate, pixel portions are arranged in a matrix at intersections of said signal lines and scanning lines, and said signal detective circuit comprises:

a signal read transistor which has a drain or source and gate connected to the pixel electrode, a source or drain connected to said signal line, and a gate connected to said scanning line, and is controlled in operation by staid scanning line to output the potential of the pixel electrode to said signal line;

a protective transistor which has a drain or source connected to the pixel electrode, and a source or drain connected to a predetermined potential line, and connects the pixel electrode to the predetermined potential line when the potential of the pixel electrode reaches not less than a predetermined potential; and a threshold adjustment circuit including at least one transistor which receives a power supply voltage, has an input terminal connected to the pixel electrode and an output terminal connected to the gate of said protective transistor, and adjusts an operating threshold of said protective transistor in accordance with the potential of the pixel electrode, said signal read transistor and protective transistor having an LDD structure on a high-potential side.

8. An image detection device comprising:

a signal line and scanning line which run perpendicularly to each other on a substrate;

a pixel portion arranged at an intersection of said signal line and scanning line and including a photoelectric conversion film for converting incident light into a signal charge to accumulate the signal charge and a pixel electrode;

a signal detective circuit including thin film transistors controlled in operation by said scanning line to read out a potential of the pixel electrode; and a scanning line driving circuit for driving said scanning line, wherein a thin film transistor having a source or drain connected to the pixel electrode out of the thin film transistors included in said signal detective circuit has a multi-gate structure, and wherein said signal detective circuit comprises:

a signal read transistor which has a drain or source connected to the pixel electrode, a source or drain connected to said signal line, and a gate connected to said scanning line, and is controlled in operation by said scanning line to output the potential of the pixel electrode to said signal line;

a protective transistor which has a drain or source connected to the pixel electrode, and a source or drain connected to a predetermined potential line, and connects the pixel electrode to the predetermined potential line when the potential of the pixel electrode reaches not less than a predetermined potential; and a threshold adjustment circuit including at least one transistor which receives a power supply voltage, has an input terminal connected to the pixel electrode and an output terminal connected to the gate of said protective transistor, and adjusts an operating threshold of said protective transistor in accordance with the potential of the pixel electrode, said signal read transistor and protective transistor having a multi-gate structure, and the transistor included in said threshold adjustment circuit having a single-gate structure.

9. An image detection device comprising:

a signal line and scanning line which run perpendicularly to each-other on a substrate;

a pixel portion arranged at an intersection of said signal line and scanning line and including a photoelectric conversion film for converting incident light into a signal charge to accumulate the signal charge and a pixel electrode;

a signal detective circuit including thin film transistors controlled in operation by said scanning line to read out a potential of the pixel electrode; and a scanning line driving circuit for driving said scanning line, wherein a thin film transistor having a source or drain connected to the pixel electrode out of the thin film transistors included in said signal detective circuit has a multi-gate structure, wherein pluralities of signal lines and scanning lines run on the substrate, pixel portions are arranged in a matrix at intersections of said signal lines and scanning lines, said signal detective circuit includes thin film transistors controlled in operation by the respective scanning lines to read out potentials of corresponding pixel electrodes, and at least one thin film transistor having a source or drain connected to said pixel electrode out of the thin film transistors included in said signal detective circuit has a multi-gate structure, and wherein said signal detective circuit comprises:

a signal read transistor which has a drain or source connected to the pixel electrode, a source or drain connected to said signal line, and a gate connected to said scanning line, and is controlled in operation by said scanning line to output the potential of the pixel electrode to said signal line;

a protective transistor which has a drain or source connected to the pixel electrode, and a source or drain connected to a predetermined potential line, and connects the pixel electrode to the predetermined potential line when the potential of the pixel electrode reaches not less than a predetermined potential; and a threshold adjustment circuit including at least one transistor which receives a power supply voltage, has an input terminal connected to the pixel electrode and an output terminal connected to the gate of said protective transistor, and adjusts an operating threshold of said protective transistor in accordance with the potential of the pixel electrode, said signal read transistor and protective transistor having a multi-gate structure, and the transistor included in said threshold adjustment circuit having a single-gate structure.

10. An image detection device comprising:

a signal line and scanning line which run perpendicularly to each other on a substrate;

a pixel portion arranged at an intersection of said signal line and scanning line and including a photoelectric conversion film for converting incident light into a signal charge to accumulate the signal charge and a pixel electrode;

a signal detective circuit including thin film transistors controlled in operation by said scanning line to read out a potential of the pixel electrode; and a scanning line driving circuit for driving said scanning line, wherein a thin film transistor having a source or drain connected to the pixel electrode out of the thin film transistors included in said signal detective circuit has LDD structures on high- and low-potential sides in which an LDD length is larger on the high-potential side than the low-potential side, and wherein said signal detective circuit comprises:

a signal read transistor which has a drain or source connected to the pixel electrode, a source or drain connected to said signal line, and a gate connected to said scanning line, and is controlled in operation by said scanning line to output the potential of the pixel electrode to said signal line;

a protective transistor which has a drain or source connected to the pixel electrode, and a source or drain connected to a predetermined potential line, and connects the pixel electrode to the predetermined potential line when the potential of the pixel electrode reaches not less than a predetermined potential; and a threshold adjustment circuit including at least one transistor which receives a power supply voltage, has an input terminal connected to the pixel electrode and an output terminal connected to the gate of said protective transistor, and adjusts an operating threshold of said protective transistor in accordance with the potential of the pixel electrode, said signal read transistor and protective transistor having LDD structures on high- and low-potential sides in which an LDD length is larger on the high-potential side than the low-potential side.

11. An image detection device comprising:

a signal line and scanning line which run perpendicularly to each other on a substrate;

a pixel portion arranged at an intersection of said signal line and scanning line and including a photoelectric conversion film for converting incident light into a signal charge to accumulate the signal charge and a pixel electrode;

a signal detective circuit; and a scanning line driving circuit for driving said scanning line, wherein pluralities of signal lines and scanning lines run on the substrate, pixel portions are arranged in a matrix at intersections of said signal lines and scanning lines, and said signal detective circuit comprises:

a signal read transistor which has a drain or source connected to the pixel electrode, a source or drain connected to said signal line, and a gate connected to said scanning line, and is controlled in operation by said scanning line to output the potential of the pixel electrode to said signal line;

a protective transistor which has a drain or source connected to the pixel electrode, and a source or drain connected to a predetermined potential line, and connects the pixel electrode to the predetermined potential line when the potential of the pixel electrode reaches not less than a predetermined potential; and a threshold adjustment circuit including at least one transistor which receives a power supply voltage, has an input terminal connected to the pixel electrode and an output terminal connected to the gate of said protective transistor, and adjusts an operating threshold of said protective transistor in accordance with the potential of the pixel electrode, said signal read transistor and protective transistor having LDD structures on high- and low-potential sides in which an LDD length is larger on the high-potential side than the low-potential side.

12. An image detection device comprising:

a signal line and scanning line which run perpendicularly to each other on a substrate; a pixel portion arranged at an intersection of said signal line and scanning line and including a photoelectric conversion film for converting incident light into a signal charge to accumulate the signal charge and a pixel electrode; a signal detective circuit including thin film transistors controlled in operation by said scanning line to read out a potential of the pixel electrode; and a scanning line driving circuit for driving said scanning line, wherein said signal detective circuit comprises:

a protective transistor which has a drain or source and gate connected to the pixel electrode, and a source or drain connected to a first predetermined potential terminal, and connects the pixel electrode to the first predetermined potential terminal when the potential of the pixel electrode reaches not less than a predetermined potential;

a reset transistor which has a drain or source connected to the pixel electrode, and a source or drain connected to a second predetermined potential terminal, and connects the pixel electrode to the second predetermined potential terminal when a gate receives a reset signal; and a voltage conversion circuit including at least one transistor which receives a power supply voltage, has an input terminal connected to the pixel electrode and an output terminal connected to said signal line, and generates a voltage signal corresponding to the potential of the pixel electrode to output the voltage signal to said signal line, said protective transistor and reset transistor having an LDD structure on a high-potential side.

13. An image detection device comprising:

a signal line and scanning line which run perpendicularly to each other on a substrate;

a pixel portion arranged at an intersection of said signal line and scanning line and including a photoelectric conversion film for converting incident light into a signal charge to accumulate the signal charge and a pixel electrode;

a signal detective circuit including thin film transistors controlled in operation by said scanning line to read out a potential of the pixel electrode; and a scanning line driving circuit for driving said scanning line, wherein pluralities of signal lines and scanning lines run on the substrate, pixel portions are arranged in a matrix at intersections of said signal lines and scanning lines, and said signal detective circuit comprises:

a protective transistor which has a drain or source and gate connected to the pixel electrode, and a source or drain connected to a first predetermined potential terminal, and connects the pixel electrode to the first predetermined potential terminal when the potential of the pixel electrode reaches not less than a predetermined potential;

a reset transistor which has a drain or source connected to the pixel electrode, and a source or drain connected to a second predetermined potential terminal, and connects the pixel electrode to the second predetermined potential terminal when a gate receives a reset signal; and a voltage conversion circuit including at least one transistor which receives a power supply voltage, has an input terminal connected to the pixel electrode and an output terminal connected to said signal line, and generates a voltage signal corresponding to the potential of the pixel electrode to output the voltage signal to said signal line, said protective transistor and reset transistor having an LDD structure on a high-potential side.

14. An image detection device comprising:

a signal line and scanning line which run perpendicularly to each other on a substrate;

a pixel portion arranged at an intersection of said signal line and scanning line and including a photoelectric conversion film for converting incident light into a signal charge to accumulate the signal charge and a pixel electrode;

a signal detective circuit including thin film transistors controlled in operation by said scanning line to read out a potential of the pixel electrode; and a scanning line driving circuit for driving said scanning line, wherein a thin film transistor having a source or drain connected to the pixel electrode out of the thin film transistors included in said signal detective circuit has a multi-gate structure, and wherein said signal detective circuit comprises:

a protective transistor which has a drain or source and gate connected to the pixel electrode, and a source or drain connected to a first predetermined potential terminal, and connects the pixel electrode to the first predetermined potential terminal when the potential of the pixel electrode reaches not less than a predetermined potential;

a reset transistor which has a drain or source connected to the pixel electrode, and a source or drain connected to a second predetermined potential terminal, and connects the pixel electrode to the second predetermined potential terminal when a gate receives a reset signal; and a voltage conversion circuit including at least one transistor which receives a power supply voltage, has an input terminal connected to the pixel electrode and an output terminal connected to said signal line, and generates a voltage signal corresponding to the potential of the pixel electrode to output the voltage signal to said signal line, said protective transistor and reset transistor having a multi-gate structure, and the transistor included in said voltage conversion circuit having a single-gate structure.

15. An image detection device comprising:

a signal line and scanning line which run perpendicularly to each other on a substrate;

a pixel portion arranged at an intersection of said signal line and scanning line and including a photoelectric conversion film for converting incident light into a signal charge to accumulate the signal charge and a pixel electrode;

a signal detective circuit including thin film transistors controlled in operation by said scanning line to read out a potential of the pixel electrode; and a scanning line driving circuit for driving said scanning line, wherein a thin film transistor having a source or drain connected to the pixel electrode out of the thin film transistors included in said signal detective circuit has a multi-gate structure, wherein pluralities of signal lines and scanning lines run on the substrate, pixel portions are arranged in a matrix at intersections of said signal lines and scanning lines, said signal detective circuit includes thin film transistors controlled in operation by the respective scanning lines to read out potentials of corresponding pixel electrodes, and at least one thin film transistor having a source or drain connected to said pixel electrode out of the thin film transistors included in said signal detective circuit has a multi-gate structure, and wherein said signal detective circuit comprises:

a protective transistor which has a drain or source and gate connected to the pixel electrode, and a source or drain connected to a first predetermined potential terminal, and connects the pixel electrode to the first predetermined potential terminal when the potential of the pixel electrode reaches not less than a predetermined potential;

a reset transistor which has a drain or source connected to the pixel electrode, and a source or drain connected to a second predetermined potential terminal, and connects the pixel electrode to the second predetermined potential terminal when a gate receives a reset signal; and a voltage conversion circuit including at least one transistor which receives a power supply voltage, has an input terminal connected to the pixel electrode and an output terminal connected to said signal line, and generates a voltage signal corresponding to the potential of the pixel electrode to output the voltage signal to said signal line, said protective transistor and reset transistor having a multi-gate structure, and the transistor included in said voltage conversion circuit having a single-gate structure.

16. An image detection device comprising:

a signal line and scanning line which run perpendicularly to each other on a substrate;

a pixel portion arranged at an intersection of said signal line and scanning line and including a photoelectric conversion film for converting incident light into a signal charge to accumulate the signal charge and a pixel electrode;

a signal detective circuit including thin film transistors controlled in operation by said scanning line to read out a potential of the pixel electrode; and a scanning line driving circuit for driving said scanning line, wherein a thin film transistor having a source or drain connected to the pixel electrode out of the thin film transistors included in said signal detective circuit has LDD structures on high- and low-potential sides in which an LDD length is larger on the high-potential side than the low-potential side, and wherein said signal detective circuit comprises:

a protective transistor which has a drain or source and gate connected to the pixel electrode, and a source or drain connected to a first predetermined potential terminal, and connects the pixel electrode to the first predetermined potential terminal when the potential of the pixel electrode reaches not less than a predetermined potential;

a reset transistor which has a drain or source connected to the pixel electrode, and a source or drain connected to a second predetermined potential terminal, and connects the pixel electrode to the second predetermined potential terminal when a gate receives a reset signal; and a voltage conversion circuit including at least one transistor which receives a power supply voltage, has an input terminal connected to the pixel electrode and an output terminal connected to said signal line, and generates a voltage signal corresponding to the potential of the pixel electrode to output the voltage signal to said signal line, said protective transistor and reset transistor having LDD structures on high- and low-potential sides in which an LDD length is larger on the high-potential side than the low-potential side.

17. An image detection device comprising:

a signal line and scanning line which run perpendicularly to each other on a substrate;

a pixel portion arranged at an intersection of said signal line and scanning line and including a photoelectric conversion film for converting incident light into a signal charge to accumulate the signal charge and a pixel electrode;

a signal detective circuit; and a scanning line driving circuit for driving said scanning line, wherein pluralities of signal lines and scanning lines run on the substrate, pixel portions are arranged in a matrix at intersections of said signal lines and scanning lines, and said signal detective circuit comprises:

a protective transistor which has a drain or source and gate connected to the pixel electrode, and a source or drain connected to a first predetermined potential terminal, and connects the pixel electrode to the first predetermined potential terminal when the potential of the pixel electrode reaches not less than a predetermined potential;

a reset transistor which has a drain or source connected to the pixel electrode, and a source or drain connected to a second predetermined potential terminal, and connects the pixel electrode to the second predetermined potential terminal when a gate receives a reset signal; and a voltage conversion circuit including at least one transistor which receives a power supply voltage, has an input terminal connected to the pixel electrode and an output terminal connected to said signal line, and generates a voltage signal corresponding to the potential of the pixel electrode to output the voltage signal to said signal line, said protective transistor and reset transistor having LDD structures on high- and low-potential sides in which an LDD length is larger on the high-potential side than the low-potential side.

* * * * *